United States Patent
Yamaguchi et al.

(10) Patent No.: US 7,808,253 B2
(45) Date of Patent: Oct. 5, 2010

(54) TEST METHOD OF MICROSTRUCTURE BODY AND MICROMACHINE

(75) Inventors: Mayumi Yamaguchi, Kanagawa (JP); Konami Izumi, Kanagawa (JP); Fuminori Tateishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 824 days.

(21) Appl. No.: 11/565,135

(22) Filed: Nov. 30, 2006

(65) Prior Publication Data

US 2007/0143048 A1 Jun. 21, 2007

(30) Foreign Application Priority Data

Dec. 2, 2005 (JP) ............................. 2005-350035

(51) Int. Cl.
*G01R 27/32* (2006.01)
*G01R 31/26* (2006.01)

(52) U.S. Cl. .................. 324/637; 324/633; 216/61; 216/86; 438/17

(58) Field of Classification Search .............. 324/76.51, 324/633, 637, 652; 216/61, 86
See application file for complete search history.

(56) References Cited

U.S. PATENT DOCUMENTS

| | | | | |
|---|---|---|---|---|
| 5,865,666 A | * | 2/1999 | Nagahara | 438/691 |
| 6,092,530 A | * | 7/2000 | Weissman et al. | 128/899 |
| 6,206,835 B1 | * | 3/2001 | Spillman et al. | 600/485 |
| 6,278,379 B1 | * | 8/2001 | Allen et al. | 324/655 |
| 6,330,885 B1 | * | 12/2001 | Weissman et al. | 128/899 |
| 6,772,011 B2 | * | 8/2004 | Dolgin | 607/61 |
| 6,967,362 B2 | * | 11/2005 | Nam et al. | 257/254 |
| 6,974,652 B1 | * | 12/2005 | Lukanc et al. | 430/5 |
| 7,105,365 B2 | | 9/2006 | Hiroki et al. | |
| 7,553,280 B2 | * | 6/2009 | Lesho | 600/365 |
| 2002/0151816 A1 | * | 10/2002 | Rich et al. | 600/547 |
| 2003/0169169 A1 | * | 9/2003 | Wuidart et al. | 340/572.7 |
| 2006/0132167 A1 | * | 6/2006 | Chen | 324/765 |

FOREIGN PATENT DOCUMENTS

JP 2005-043514 2/2005
WO 2006/104019 A1 10/2006

* cited by examiner

*Primary Examiner*—Timothy J Dole
(74) *Attorney, Agent, or Firm*—Fish & Richardson P.C.

(57) ABSTRACT

It is an object to provide a test method of a process, an electric characteristic, and a mechanical characteristic of a structure body in a micromachine without contact. A structure body including a first conductive layer, a second conductive layer provided in parallel to the first conductive layer, and a sacrifice layer or a space provided between the first conductive layer and the second conductive layer is provided; an antenna connected to the structure body is provided; electric power is supplied to the structure body wirelessly through the antenna; and an electromagnetic wave generated from the antenna is detected as a characteristic of the structure body.

7 Claims, 20 Drawing Sheets

Dicing

Packaging

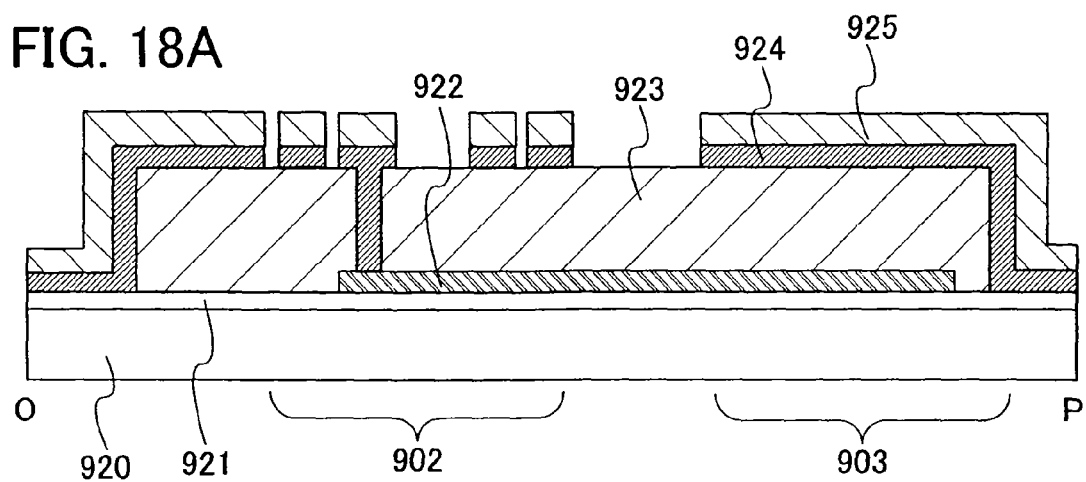
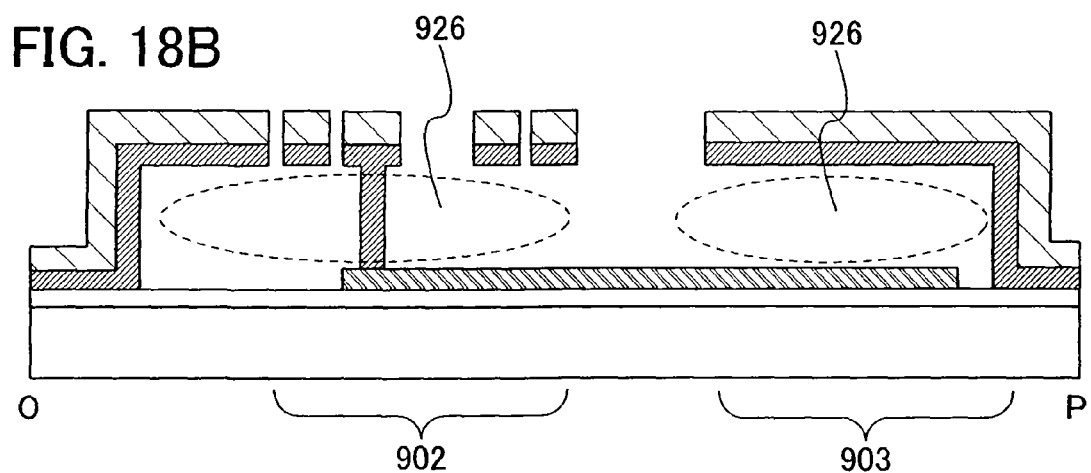

TEST METHOD OF MICROSTRUCTURE BODY AND MICROMACHINE

BACKGROUND OF THE INVENTION

1. Field of the Invention

The present invention relates to a test method of a structure body included in a micromachine which is manufactured by surface micromachining, and a micromachine and a structure body which are manufactured by employing the test method.

2. Description of the Related Art

A micromachine is also called a MEMS (Micro Electro Mechanical System) or a MST (Micro System Technology), and refers to a general system in which a minute mechanical structure body (also referred to as a microstructure body, or simply, a structure body) and an electric circuit are combined. In addition, a micromachine includes a bulk micromachine in which a structure body is manufactured by utilizing crystal anisotropy of a silicon substrate and a surface micromachine in which a spatial structure body is manufactured by stacking thin films over various substrates. When manufacturing either micromachine, a structure body having a certain function and a peripheral circuit (electric circuit) are integrated in an on-chip mode or an on-package mode. Here, in an on-chip mode, an electric circuit having a semiconductor element and a structure body are manufactured over the same substrate, whereas, in an on-package mode, an electric circuit and a structure body each manufactured over a different substrate are put in one package to be a final product.

A cause to decrease yield is different between a structure body manufactured by a surface micromachining or bulk micromachining technique and a peripheral circuit manufactured by a conventional LSI technique. Therefore, yield of a micromachine having both the structure body and the peripheral circuit is the product of the yield of the structure body and the yield of the electric circuit either in an on-chip mode or an on-package mode; therefore, it is difficult to increase productivity.

In particular, yield is low in a structure body. There are various reasons such as a problem that a substrate to which a process check, like a check on a film thickness or an etching rate, is carried out cannot be returned to a process and is required to be thrown away, it is difficult to evaluate whether a structure body operates normally until the structure body is mounted on a final product, and the like. In order to solve these problems, various researches are carried out (see, for example, Patent Document 1: Japanese Published Patent Application No. 2005-43514 and Patent Document 2: Japanese Patent No. 3549105).

In Patent Document 1, there is proposed a measuring method and a test method of a device, which precisely determine whether a structure body is transformed due to inner stress or whether a characteristic that is set at a time of designing is obtained. In addition, in Patent Document 2, there is proposed a method in which a mechanical characteristic of an actuator is tested by utilizing a frequency characteristic of a structure body.

By the techniques as described above, a structure body can be tested by microscope observation, an electric characteristic measurement, or the like, and a substrate is not required to be thrown away after the test. However, for example, the test in Patent Document 1 is carried out to a test pattern, and thus, a manufactured structure body itself cannot be tested. In addition, the test in Patent Document 2 can be carried out only after completing manufacturing of a structure body, and thus, a test for confirming a process cannot be carried out.

In general, it is not easy to implement a test of process confirmation or an electric characteristic to all the structure bodies that are manufactured over the substrate since, because of complicated structures and mechanisms, a high technique and an expensive device are necessary and the test takes long time. In addition, an electric characteristic measurement is carried out by making a needle of a prober be in contact with a substrate, whereby a risk of breaking a structure body with a three-dimensional spatial structure is increased, differently from a general semiconductor element.

In addition, when a test is carried out by making a needle of a prober be in contact, a layer in a portion where the needle is in contact is peeled, or a substrate is contaminated due to a dust which has fallen.

When a contact test method is used in a manufacturing process of a general semiconductor element, a substrate is always cleaned and returned to the process. However, in the case of a micromachine with a three-dimensional spatial structure having a space, a substrate cannot be cleaned since a structure body is broken.

Further, a space in a structure body is formed by removing a sacrifice layer below a structure layer by etching. Here, when the structure layer is formed by using an opaque material (in many cases, the structure layer is opaque since metal is used for the structure layer), it is impossible to test whether the sacrifice layer is completely removed by sacrifice layer-etching, using a simple means such as an optical microscope. When a test is carried out, a substrate is divided after sacrifice layer-etching, and a cross-section thereof is observed by a SEM or the like. However, even when it is found, by this test, whether the sacrifice layer is completely removed, the substrate which has been already divided cannot be returned to the process.

Accordingly, although a peripheral circuit which operates assuredly is selected by a test when a structure body and the peripheral circuit are integrated in an on-package mode, it is difficult to test all the structure bodies, and all the structure bodies are tested for the first time in a final test for testing whether the structure body operates normally after packaging. This is a cause to significantly decrease productivity of a micromachine.

SUMMARY OF THE INVENTION

In view of the foregoing problems, it is an object of the present invention to provide a method for easily testing a process, an electric characteristic, and a mechanical characteristic of a structure body of a micromachine without contact. In addition, it is another object of the present invention to provide a method for testing a process, an electric characteristic, and a mechanical characteristic of all the structure bodies by using a pattern or a circuit provided for a test.

In a method for testing a microstructure body according to the present invention, a circuit is formed by connecting an antenna to a structure body, which includes a first conductive layer, a second conductive layer, and a sacrifice layer or a space provided between the first conductive layer and the second conductive layer; electric power is supplied to the structure body wirelessly through the antenna; and an electromagnetic wave generated from the antenna is detected as a characteristic of the structure body.

In another method for testing a microstructure body according to the present invention, a circuit is formed by connecting a power supply circuit to a structure body, which includes a first conductive layer, a second conductive layer, and a sacrifice layer or a space provided between the first conductive layer and the second conductive layer, and connecting the structure body and the power supply circuit to an antenna; electric power is supplied to the structure body and the power supply circuit wirelessly through the antenna; and an electromagnetic wave generated from the antenna is detected as a characteristic of the structure body.

In another method for testing a microstructure body according to the present invention, a circuit is formed by connecting a power supply circuit to a structure body, which includes a first conductive layer, a second conductive layer, and a sacrifice layer or a space provided between the first conductive layer and the second conductive layer, and connecting the structure body and the power supply circuit to an antenna; electric power is supplied to the structure body and an electric circuit wirelessly through the antenna; and an electromagnetic wave generated from the antenna is detected as a characteristic of the structure body and the electric circuit.

In another method for testing a microstructure body according to the present invention, a circuit is formed by connecting a control circuit to a structure body, which includes a first conductive layer, a second conductive layer, and a sacrifice layer or a space provided between the first conductive layer and the second conductive layer, connecting a power supply circuit to the control circuit, and connecting at least one of the structure body, the control circuit, and the power supply circuit to an antenna; electric power is supplied to the structure body, the control circuit, and the power supply circuit wirelessly through the antenna; and an electromagnetic wave generated from the antenna is detected as a characteristic of the structure body.

The control circuit includes a driver or a decoder.

The power supply circuit includes a boosting circuit.

In another method for testing a microstructure body according to the present invention, an antenna is connected to a structure body, which includes a first conductive layer, a second conductive layer, and a sacrifice layer or a space provided between the first conductive layer and the second conductive layer; a first pad is connected to the first conductive layer; a second pad is connected to the second conductive layer; electric power is supplied to the structure body from the pad; and a change in electromagnetic wave generated from the antenna is detected as a characteristic of the structure body.

In another method for testing a microstructure body according to the present invention, an antenna is connected to a structure body, which includes a first conductive layer, a second conductive layer, and a sacrifice layer or a space provided between the first conductive layer and the second conductive layer; a first pad is connected to the first conductive layer; a second pad is connected to the second conductive layer; electric power is supplied to the structure body wirelessly through the antenna; and a voltage applied to the structure body or a current flowing in the structure body is detected as a characteristic of the structure body from the first pad and the second pad.

In another method for testing a microstructure body according to the present invention, an antenna is connected to a first structure body, which includes a first conductive layer, a second conductive layer, and a sacrifice layer or a space provided between the first conductive layer and the second conductive layer; a second structure body having the same structure as that of the first structure body is provided so as to be adjacent to the first structure body; electric power is supplied to the first structure body wirelessly through the antenna; and an electromagnetic wave generated from the antenna is detected as a characteristic of the first structure body and a characteristic of the second structure body is evaluated.

In another method for testing a microstructure body according to the present invention, a frequency or intensity of the electric power is changed, and intensity of the electromagnetic wave generated from the antenna is detected as the characteristic in relation to a change in frequency or intensity of the electric power.

In another method for testing a microstructure body according to the present invention, in a structure body which includes a first conductive layer, a second conductive layer, and a sacrifice layer or a space provided between the first conductive layer and the second conductive layer, a first pad is connected to the first conductive layer; a second pad is connected to the second conductive layer; electric power is supplied to the structure body from the first pad and the second pad; and a current flowing in the structure body is detected as a characteristic of the structure body.

In another method for testing a microstructure body according to the present invention, a first antenna is connected to a first structure body which includes a first conductive layer, a second conductive layer, and a sacrifice layer or a space provided between the first conductive layer and the second conductive layer and has a known characteristic; a second structure body having the same structure as that of the first structure body is connected to a second antenna having the same structure as that of the first antenna; electric power is supplied to the first structure body wirelessly through the first antenna; an electromagnetic wave generated from the first antenna is detected as a reference characteristic of the second structure body; electric power is supplied to the second structure body wirelessly through the second antenna; an electromagnetic wave generated from the second antenna is detected as a characteristic of the second structure body; and the characteristic of the second structure body is evaluated by comparing the detected characteristic of the second structure body with the reference characteristic of the second structure body.

In the method for testing a microstructure body according to the present invention, for example, a frequency of the electric power is changed, and intensity of the electromagnetic wave generated from the first antenna and the second antenna is detected as the characteristic in relation to a change in frequency of the electric power.

In the method for testing a microstructure body according to the present invention, the space is formed by removing a sacrifice layer. The sacrifice layer is removed by etching, and in this specification, this etching step is referred to as sacrifice layer-etching.

In the method for testing a microstructure body according to the present invention, the first structure body and the second structure body can be provided over the same substrate.

In the method for testing a microstructure body according to the present invention, the first structure body and the second structure body can be provided over different substrates.

In another method for testing a microstructure body according to the present invention, the characteristic is a thickness of the sacrifice layer, stress to the sacrifice layer, a height of the space (a distance between the first conductive layer and the second conductive layer), a spring constant of the structure body, a resonance frequency of the structure body, a drive voltage of the structure body, or presence of the sacrifice layer. In addition, by combing those measurement results, inner stress of the structure layer can also be obtained.

It is to be noted that, in the present invention, the first conductive layer and the second conductive layer are preferably provided in parallel.

The intensity of the electric power is changed, and the intensity of the electromagnetic wave generated from the antenna is detected as a characteristic in relation to the intensity of the electric power.

The frequency of the electric power is changed, and a change in electromagnetic wave generated from the antenna is detected in relation to a change in frequency of the electric power, and a thickness of the sacrifice layer is evaluated on a frequency at which the intensity of the electromagnetic wave is a maximum.

The structure body is formed over a substrate having an insulating surface.

A micromachine according to the present invention includes a microstructure body which is tested by employing any of the above test methods of a microstructure body and an electric circuit connected to the microstructure body.

A micromachine according to the present invention includes a first conductive layer formed over a substrate and a second conductive layer provided in parallel to the first conductive layer, where at least one of the first conductive layer and the second conductive layer is connected to a wiring that is disconnected.

The first conductive layer is formed over an insulating substrate.

The insulating substrate is a glass substrate or a plastic substrate.

The first conductive layer and the second conductive layer are provided in parallel. It is to be noted that, in this specification, "parallel" also means a state in which the layer is slightly misaligned from a parallel state. That state may include a state when the layer is misaligned by approximately ±5 degrees, for example.

A micromachine according to the present invention includes, over a substrate, a first conductive layer, a second conductive layer provided in parallel to the first conductive layer, a first wiring connected to the same node as that of the first conductive layer, and a second wiring connected to the same node as that of the second conductive layer, where the substrate is divided so that the first wiring and the second wiring are disconnected. In other words, a side surface of the substrate and a cross-section of the first wiring or the second wiring are almost in alignment. In such a manner, when the wiring is kept disconnected, a step of removing the wiring can be omitted.

In the present invention, a micromachine includes a structure body (also referred to as a microstructure body) with a three-dimensional spatial structure having a space inside and an electric circuit for controlling the structure body or detecting output from the structure body. The structure body includes two parallel electrodes facing each other through the space, where one of the two electrodes is a fixed electrode (a first conductive layer in this specification) that is fixed to the substrate and not moved, and the other is a movable electrode (a second conductive layer in this specification) that can be moved. In addition, although the second conductive layer that can be moved may be formed using a single layer, in many cases, a movable layer is formed by stacking an insulating layer or the like over the second conductive layer. In this specification, the second conductive layer or the movable layer that is formed by stacking an insulating layer is referred to as a structure layer.

In the present invention, by providing a test circuit in which an antenna and a structure body are connected, a micromachine during or after a manufacturing process can be tested without contact. Therefore, those who implement the present invention can easily carry out a test because position precision in the test is not required, unlike a test where a needle of a prober is in contact. Further, when a plurality of items or a plurality of substrates are tested, since time required for positioning a needle is not necessary, test time can be shortened, and productivity can be improved. Moreover, a risk of breaking a structure body with a three-dimensional spatial structure having a space due to needle contact can be eliminated, and the substrate can be prevented from being contaminated due to needle contact.

In addition, a thickness, an operating characteristic, or the like can be tested without contact; therefore, the substrate can be returned to the process after the test. Accordingly, it is not necessary to divide or throw away the substrate in each test, and productivity can be improved.

In addition, by detecting a change depending on supplied electric power or a frequency, a state below an opaque layer, such as a thickness of a sacrifice layer below a structure layer, progress of sacrifice layer-etching, or a height of a space can be tested. Further, when a test circuit has a wireless communication circuit including an antenna, a control circuit, and the like, it is possible to test various dynamic characteristics or static characteristics of a structure body, such as inner stress of the structure layer, a spring constant of the structure layer, a resonance frequency of the structure layer, or a drive voltage of the structure body.

By employing a test method according to the present invention, a characteristic of a structure body can be tested during manufacturing of a micromachine, preferably before sacrifice layer-etching or dividing the substrate. Accordingly, a possibility of repairing a defect that is found is increased, and productivity can be improved.

In addition, since an antenna or the like as well as a structure body included in a test circuit can be manufactured by a MEMS technique, it is also possible to concurrently form a high-sensitive wireless communication circuit so as to improve test precision.

BRIEF DESCRIPTION OF THE DRAWINGS

In the accompanying drawings:

FIGS. 18A and 18B are views each explaining a manufacturing method of a structure body according to the present invention;

DESCRIPTION OF THE INVENTION

Figure 1A:
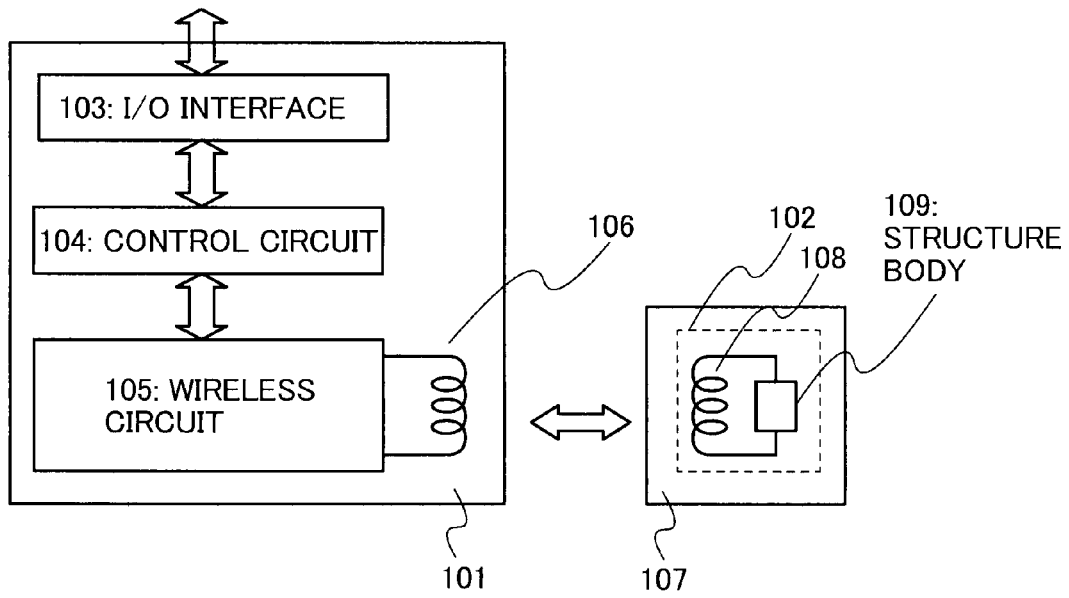
FIGS. 1A and 1B are diagrams each explaining a measuring method of a micromachine according to the present invention.

Hereinafter, embodiment modes of the present invention will be described with reference to the accompanying drawings. It is to be noted that the present invention is not limited to the following description since it is easily understood by those skilled in the art that modes and details thereof can be modified in various ways without departing from the purpose and the scope of the invention. Therefore, the present invention should not be interpreted as being limited to the description of the embodiment modes to be given below. Further, in describing a structure of the present invention with reference to the drawings, the same reference numerals are used for the same portions or portions having the same functions in different drawings.

Embodiment Mode 1

This embodiment mode will describe a test method of a micromachine according to the present invention and a circuit that is provided for carrying out a test. In a test method of a micromachine according to the present invention, a circuit in which an object to be tested, i.e. a structure body forming a micromachine, and an antenna are connected is provided, and a test is carried out wirelessly by using an electromagnetic wave. In this specification, the circuit provided for a test is referred to as a test circuit.

FIG. 1A shows a test device 101 and a test circuit 102. The test device 101 includes an input/output interface 103 by which operation is performed by a measurer or a measurement result is outputted, a control circuit 104 which controls wireless communication in accordance with a measurement item, and a wireless circuit 105 which communicates with the test circuit 102. The wireless circuit 105 includes a variable resistor; a variable capacitor; a variable power supply which can change a level of outputted electric power, a frequency, and the like; and an antenna 106, and emits an electromagnetic wave of a frequency and electric power in accordance with the measurement item from the antenna 106 by control of the control circuit 104.

The test circuit 102 includes, over a substrate 107, an antenna 108 and a test element that is an object to be tested, i.e. a structure body 109 forming a micromachine. The test circuit 102 receives the electromagnetic wave emitted from the test device 101, and electric power is supplied to the structure body 109 by induced electromotive force which is generated in the antenna 108.

When a frequency, electric power, and the like of the electromagnetic wave emitted from the antenna 106 of the test device 101 are changed, a current which flows in the test circuit 102 is changed in accordance with a characteristic of the structure body 109, and an electromagnetic wave in accordance with the current change is generated from the antenna 108 of the test circuit 102. Therefore, in the test method according to the present invention, a characteristic of the structure body 109 can be tested without contact when the antenna 106 of the test device 101 receives the electromagnetic wave.

Figure 1B:
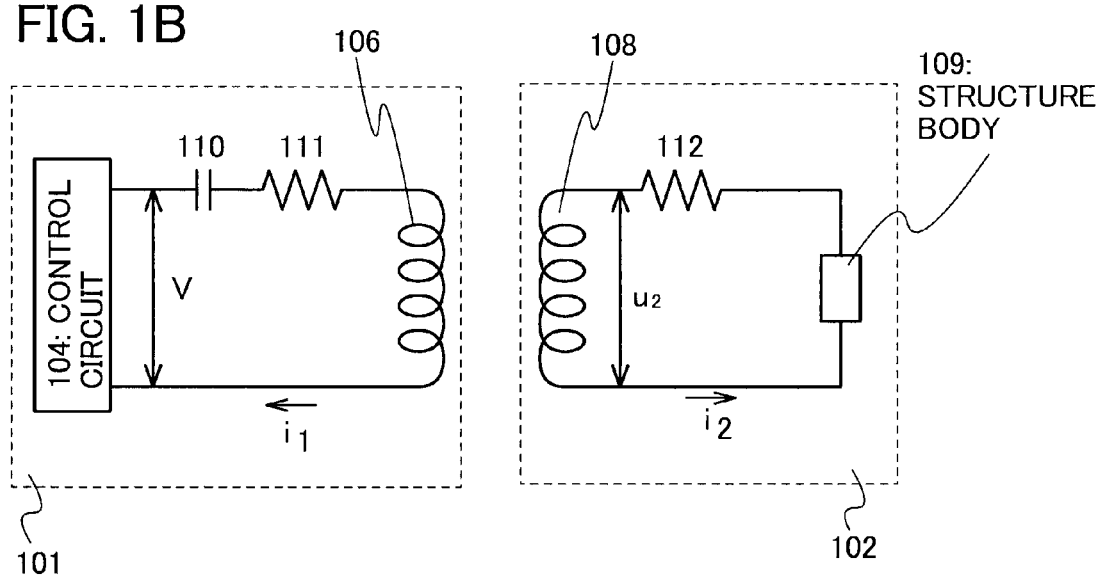

FIG. 1B is a diagram showing part of the test device (wireless circuit) and the test circuit using an electric equivalent circuit. The test device 101 can be shown as a series resonance circuit in which the control circuit 104, a capacitor 110 having a capacitance value C1, a resistor 111 having a resistance value R1, and the antenna 106 having an inductance L1 are connected in series. In this circuit, a current $i_1$ flows when a voltage V is applied by control of the control circuit 104. Here, when an applied voltage and a frequency are changed, the antenna 106 can discharge an electromagnetic wave having intensity proportional to a level of a current which flows in the circuit and having a frequency proportional to a change over time of a current.

On the other hand, the test circuit 102 can be shown as a closed circuit in which a resistor 112 having a resistance value R2, the antenna 108 having an inductance L2, and the structure body 109 having impedance Z2 are connected. In addition, the antenna 106 of the test device and the antenna 108 of the test circuit have a mutual inductance M. In the antenna 108 of the test circuit which receives the electromagnetic wave emitted from the antenna 106 of the test device, induced electromotive force $u_2$, which is proportional to the product of the mutual inductance M and a change over time of the current $i_1$ flowing in the antenna 106, is generated, and a current $i_2$ flows in the closed circuit.

The self-inductances L1 and L2 and the mutual inductance M are eigenvalues which are determined by a geometrical shape, a size, a medium, and the like of a coil. Further, in the test device 101, the capacitance value C1 of the capacitor 110, the resistance value R1 of the resistor 111, and the inductance L1 of the antenna 106 are known, and the voltage V applied to the antenna 106 of the test device and the current $i_1$ which flows in the antenna 106 are in quantity that can be measured. The current $i_2$ which flows in the test circuit 102 reflects a characteristic of the test circuit, particularly the structure body 109, and the antenna 108 generates an electromagnetic wave proportional to a level and a change over time of the current $i_2$. Accordingly, when the test circuit 102 is designed and manufactured so that the inductance L2 of the antenna 108 and the resistance value R2 of the resistor 112 each have a certain value, the impedance Z2 of the structure body 109 can be obtained.

Figure 3A:
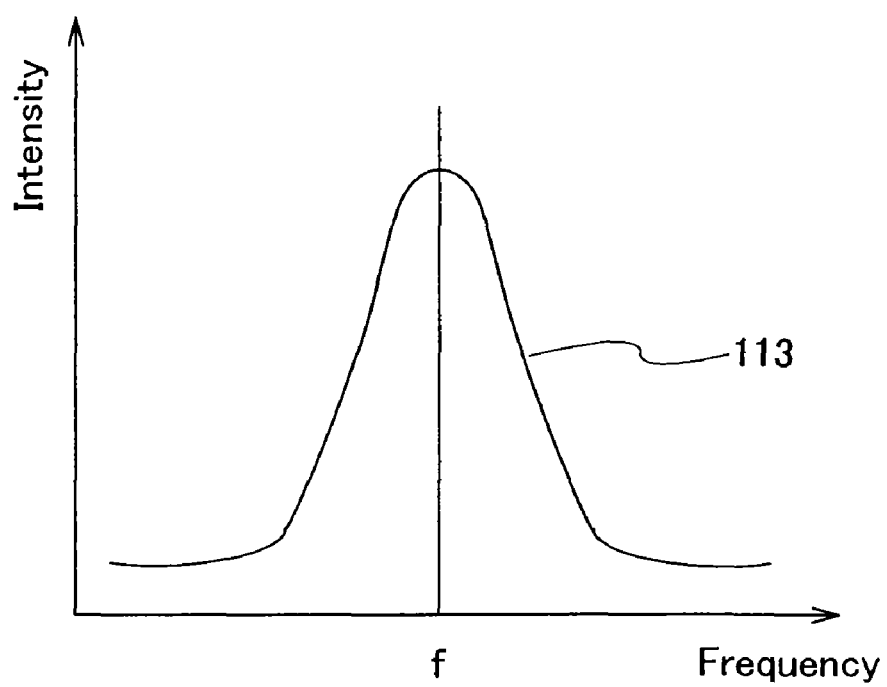
FIGS. 3A and 3B are graphs each explaining a response example of a test circuit.
Figure 3B:
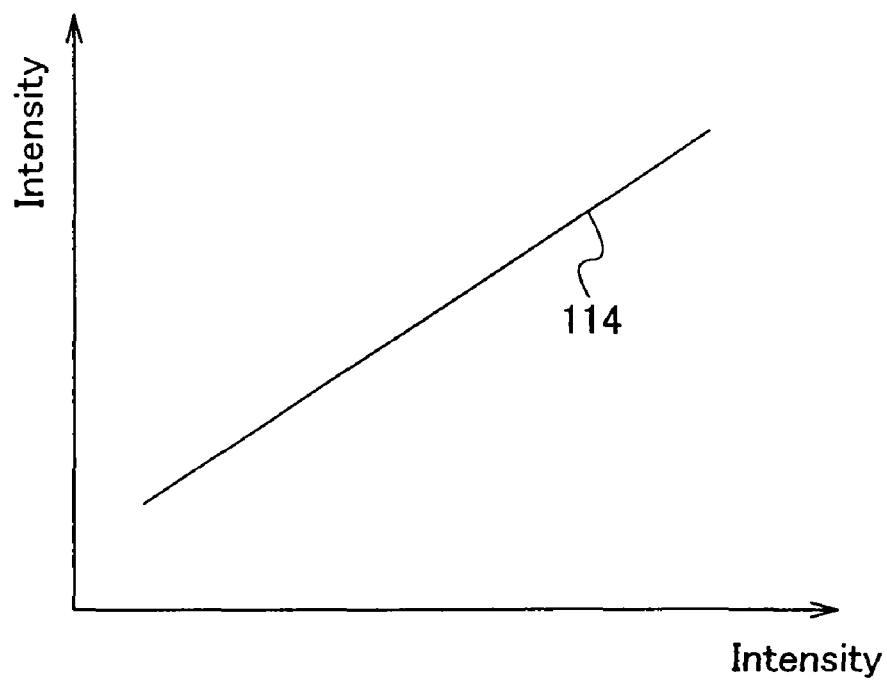

FIGS. 3A and 3B are used to explain a relation between an electromagnetic wave emitted from the antenna 106 of the test device and an electromagnetic wave generated by the antenna 108 of the test circuit. FIG. 3A shows a relation between a frequency of an electromagnetic wave emitted from the test device and intensity of an electromagnetic wave generated by the antenna of the test circuit (in the drawing, a horizontal axis indicates a frequency and a vertical axis indicates intensity). For example, when the structure body 109 has capacitive impedance, the test circuit is a resonance circuit in which a resistor, an inductance, and a capacitor are connected. Therefore, as shown in FIG. 3A, an electromagnetic wave having a peak of intensity at a specific frequency f, which is determined by the resistance value, the inductance, and the capacitance value, is outputted. In such a manner, by changing a frequency of an electromagnetic wave emitted from the test device 101, a characteristic 113 of the test circuit depending on the frequency can be obtained. For example, when the antenna 106 is manufactured so that the inductance L is L=10 µH and the structure body 109 is manufactured so that the capacitive impedance of the structure body is approximately 500 pF, a resonance frequency $f_0$=2.25 GHz can be obtained.

In addition, FIG. 3B shows a relation between intensity of an electromagnetic wave emitted from the antenna 106 of the test device 101 and intensity of an electromagnetic wave generated by the antenna 108 of the test circuit 102 (in the drawing, a horizontal axis indicates intensity of an electromagnetic wave from the test device and a vertical axis indicates intensity of an electromagnetic wave from the test circuit). For example, when the structure body 109 has resistive impedance, the test circuit is a resonance circuit in which a resistor and an inductor are connected. Here, when an electromagnetic wave of which intensity is changed at a specific frequency is emitted from the test device 101, a level of a current which flows in the test circuit is changed. Therefore, as shown in FIG. 3B, the test circuit outputs an electromagnetic wave having intensity proportional to the current value. In such a manner, when electric power of an electromagnetic wave emitted from the test device is changed, a voltage generated in and a current flowing in the test circuit are changed; thus, a characteristic 114 of the test circuit can be obtained.

Here, when the test circuit 102 is designed and manufactured so that the inductance L2 of the antenna 108 and the resistance value R2 of the resistor 112 each have a certain value, a characteristic of the test circuit, which reflects a characteristic of the structure body, can be obtained. Therefore, when a test circuit in accordance with a measurement item is manufactured and electric power in accordance with a purpose is supplied, a characteristic of the structure body, such as a thickness of a sacrifice layer formed in manufacturing the structure body, a height of a space of the structure body, film stress of a structure layer, a spring constant of the structure layer, a resonance frequency of the structure layer, or a drive voltage of the structure body can be tested without contact.

Further, from a measurement result which is obtained through the above measurement, a parameter on the characteristic of the structure body is extracted by various arithmetic operations. The characteristic of the structure body can be evaluated depending on whether the parameter is in a range that is determined by the specifications.

In addition, a test of the characteristic of the structure body using the above test circuit can be carried out not by obtaining the characteristic itself of the structure body from the measurement result, but by comparing with a measurement result of a structure body which has a known characteristic and serves as a reference. In other words, a test circuit which has a structure body having a known characteristic such as a thickness or a drive voltage is measured by using the above method. Thereafter, a test circuit which has a structure body having an unknown characteristic is measured under the same condition, and a characteristic of the structure body having an unknown characteristic can be evaluated by comparing a result thereof with a measurement result of the structure body having a known characteristic.

Figure 4:
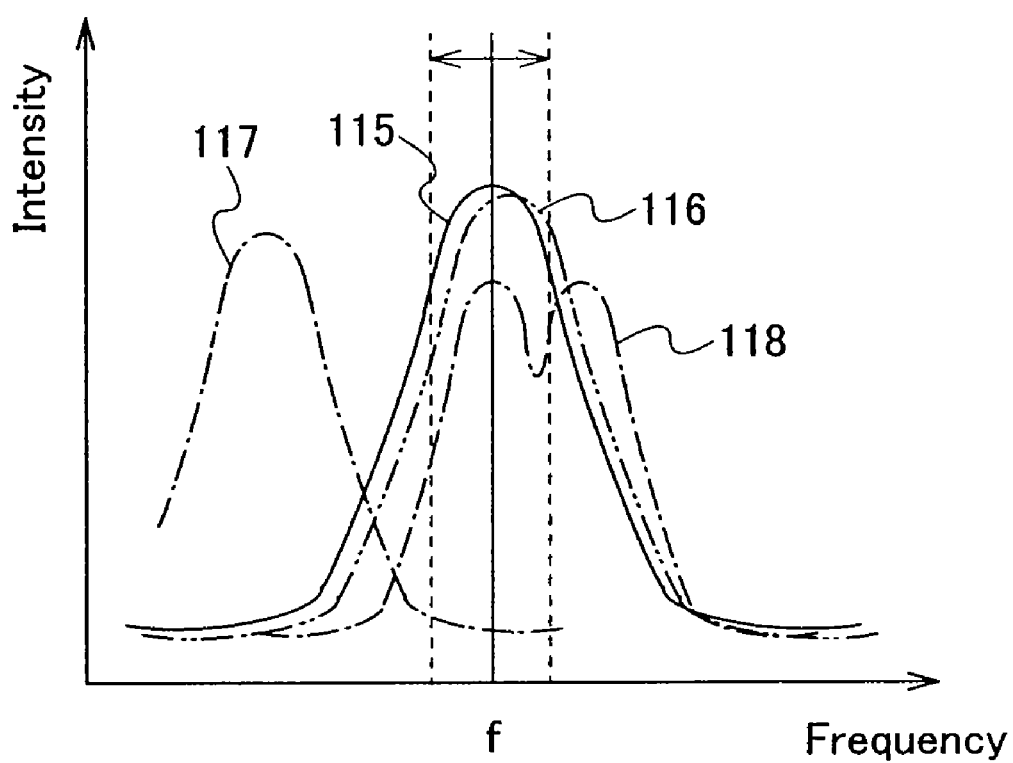
FIG. 4 is a graph explaining a response example of a test circuit.

An example of the above test method will be described with reference to FIG. 4. Here, the case will be described as an example, where the structure body 109 has capacitive impedance and the capacitance value reflects a characteristic of the structure body that is an object to be tested. First, a test circuit which has a structure body to be tested having a known characteristic is tested. Since impedance of the structure body is capacitive and the test circuit is a series resonance circuit, the test is carried out by supplying electric power in which intensity is constant and a frequency is changed from a test device, and receiving output from the test circuit. FIG. 4 shows a result. When a horizontal axis indicates a frequency of an electromagnetic wave emitted from the test device and a vertical axis indicates intensity of an electromagnetic wave outputted from the test circuit, a result, i.e. a frequency characteristic 115 which has maximum intensity at a specific frequency f can be obtained. This result is to be a measurement result of a reference frequency characteristic 115.

In addition, based on the measurement result of this frequency characteristic 115, a possible allowable range of the result may be set in the case of measuring a structure body to be tested having an unknown characteristic. For example, as shown by a dotted line in FIG. 4, a predetermined range may be set in positive and negative directions from the resonance frequency f obtained in the above measurement, and this range can be set to be an allowable range of the resonance frequency. In addition, an allowable range of output intensity, a Q value of resonance, or the like can also be set. It is desirable to set this allowable range from a range of operation specifications by selecting an optimal range to evaluate the characteristic of the structure body to be tested.

Then, the test circuit which has a structure body to be tested having an unknown characteristic is measured under the same condition. For example, in the case where a measurement result thereof is similar to the measurement result of the reference frequency characteristic 115, like a frequency characteristic 116 indicated by a two-point chain line in FIG. 4, it can be evaluated that this structure body has the same characteristic as that of the structure body that is measured beforehand. Further, also in the case where a predetermined variable is in the allowable range set as above, it can be evaluated that this structure body has the same characteristic as that of the structure body that is measured beforehand.

In addition, when the measurement result is greatly different from the reference measurement result and has maximum intensity outside the allowable range that is set as above, like a frequency characteristic 117 indicated by a one-point chain line in FIG. 4, it can be evaluated that this structure body has a characteristic that is greatly different from that of the structure body that is measured beforehand. Further, even when the maximum value is in the allowable range but the curve has two or more maximums, like a frequency characteristic 118 indicated by a one-point chain line in FIG. 4, it can be evaluated that the characteristics are different.

In such a manner, by testing a structure body having a known characteristic and a structure body having an unknown characteristic using a test circuit under the same condition and comparing those results, it is possible to evaluate the structure body having an unknown characteristic. Here, when it is evaluated whether a structure body is defective or not defective, a structure body having a characteristic that is determined to be not defective is used as a structure body having a known characteristic and serving as a reference of evaluation. Then, it is desirable to evaluate a structure body to be defective or not defective by comparing with a possible reference result of the structure body that is not defective. Such a test method by comparing results can be effectively employed when it is difficult to directly obtain a characteristic of a structure body from an electromagnetic wave outputted from a test circuit, or the like.

As described above, by employing the present invention, a characteristic of a structure body during or after a manufacturing process can be tested without contact. Therefore, those who implement the present invention can easily carry out a test because position precision in a test is not required, unlike a test where a needle of a prober is in contact. Further, when a plurality of items or a plurality of substrates are tested, since time required for positioning a needle is not necessary, test time can be shortened, and productivity can be improved. Moreover, a risk of breaking a structure body with a three-dimensional spatial structure having a space due to needle contact can be eliminated.

In addition, a thickness, an operating characteristic, or the like can be tested without contact; therefore, the substrate can be returned to the process after the test. Accordingly, it is not necessary to divide or throw away the substrate in each test, and productivity can be improved.

In addition, by detecting a change depending on intensity of supplied electric power or a frequency, various dynamic characteristics or static characteristics, or both of them of the structure body can be tested.

By employing the test method according to the present invention, a characteristic of the structure body can be tested during manufacturing of a micromachine, preferably before sacrifice layer-etching or before dividing the substrate. Accordingly, a possibility of repairing a defect that is found is increased, and productivity can be improved.

Moreover, by comparing with a measurement result of a reference structure body, in the case where the structure body is just determined to be defective or not defective in a test and individual values are not required to be obtained, the case where it is difficult to directly obtain a characteristic of a structure body from an electromagnetic wave outputted from the test circuit, or the like, the test method according to the present invention can be effectively employed.

Embodiment Mode 2

This embodiment mode will describe an example of a measuring method of a thickness without contact by employing the test method as described in the above embodiment mode.

In surface micromachining, a sacrifice layer is first formed over a substrate, and a structure layer is formed thereover. By removing the sacrifice layer thereafter, a structure body supported by part of the structure layer, which is apart from the substrate, and a micromachine having the structure body are manufactured. Here, a layer which serves as a movable portion of the structure body is referred to as a structure layer in this specification. In addition, a layer, which is removed by etching afterwards in order to form a space that is a region where the structure layer is moved, is referred to as a sacrifice layer. Further, this etching is referred to as sacrifice layer-etching. The sacrifice layer is a highly important layer, which is formed in a place which is desired to be a space and removed by sacrifice layer-etching so that the structure layer is made apart from the substrate and the space is formed. However, since the sacrifice layer is removed, the structure body or the micromachine which is a final product mode does not have a sacrifice layer in many cases.

In such a manner, since a thickness of the sacrifice layer and a height of the space (a distance from the substrate to the structure layer) which is formed by removing the sacrifice layer influence an operating characteristic of the structure body, it is highly important to control and measure these thickness and height.

This embodiment mode will describe a test method of a thickness of a sacrifice layer and a height of a space which is formed by removing the sacrifice layer without contact.

Figure 5A:
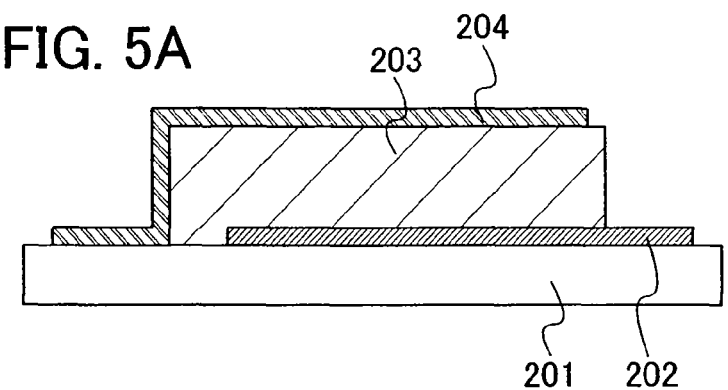
FIGS. 5A to 5D are views each explaining a micromachine according to the present invention.
Figure 5B:
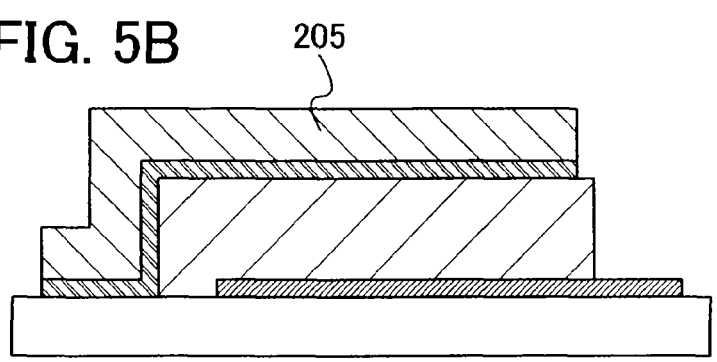
Figure 5C:
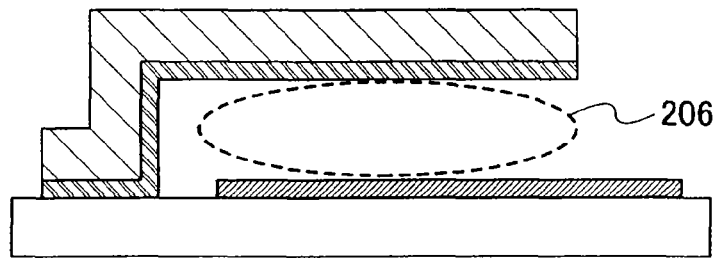
Figure 5D:
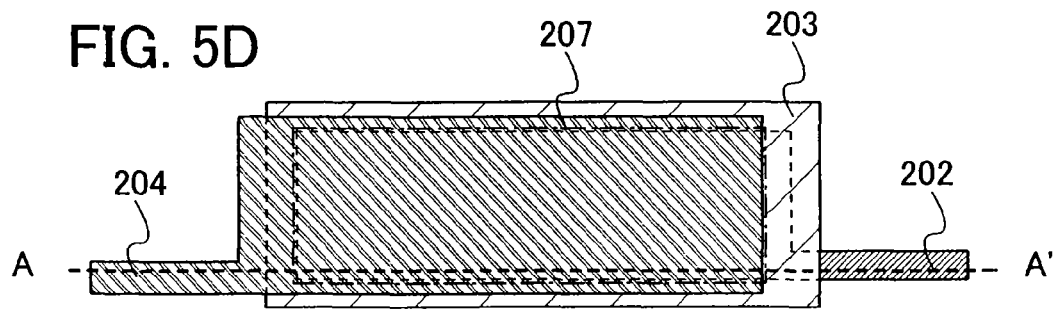

A test is carried out by using the test circuit described in the above embodiment mode. FIGS. 5A to 5C show cross-sectional views of the structure body of the test circuit, and FIG. 5D shows a top view thereof. It is to be noted that FIG. 5D is a top view before etching the sacrifice layer, and a cross-sectional view taken along a dotted line A-A' corresponds to FIG. 5A. The structure body can be manufactured by employing a process for manufacturing a general semiconductor element. First, as shown in FIG. 5A, a first conductive layer 202 is formed over a substrate 201, a sacrifice layer 203 is formed thereover, and a second conductive layer 204 is formed thereover; thus, a structure body is manufactured. Here, a silicon substrate is generally used as the substrate 201, but a glass substrate, a plastic substrate, a metal substrate, or the like may also be used. In the case of using a metal substrate or the like, surface treatment such as formation of an insulating film or the like is desirably performed. In addition, for example, by forming the structure body over a plastic substrate, a thin micromachine which is lightweight and highly flexible can be formed. Further, by thinning a silicon substrate, a glass substrate, and a metal substrate by polishing, it is also possible to form a thin micromachine.

In addition, the first conductive layer 202 and the second conductive layer 204 are each formed by using a conductive substance, and the sacrifice layer 203 is formed by using an insulating substance where a relative dielectric constant is $\in$. A thickness of each of the first conductive layer 202 and the second conductive layer 204 is, for example, more than or equal to 100 nm and less than or equal to 700 nm (400 nm, for example).

In addition, as shown in FIG. 5B, the structure body can also be formed by forming the second conductive layer 204 and a layer 205 having an insulating property over the sacrifice layer 203 and then processing them. Thereafter, as shown in FIG. 5C, the sacrifice layer 203 is removed by etching and a space 206 is formed; thus, a final structure body can be formed.

Here, an example of a material used for the first conductive layer 202, the second conductive layer 204, the sacrifice layer 203, and the layer 205 having an insulating property is shown. The first conductive layer 202 and the second conductive layer 204 are each formed by a sputtering method using a conductive material, e.g., metal such as aluminum, tungsten, tantalum, titanium, gold, or rubidium, nitride and oxide of the above metal, or alloy containing the above metal as its main component. In addition, when hydrofluoric acid is used as an etching agent in the sacrifice layer-etching, the sacrifice layer 203 is formed by using phosphorus glass (PSG) or silicon oxide, and the layer 205 having an insulating property is formed by using silicon having a polycrystalline structure. Further, when an ammonium peroxide mixture is used as an etching agent, the sacrifice layer 203 can be formed by using tungsten (W), and the layer 205 having an insulating property can be formed by using silicon oxide.

It is to be noted that the sacrifice layer 203 can be removed by employing a wet etching method or a dry etching method. By removing the sacrifice layer 203, the space 206 is formed.

In this specification, both the structure body before the sacrifice layer-etching and the structure body after the sacrifice layer-etching are each referred to as a "structure body"; however, since a structure body for forming a micromachine is a structure body having a space through sacrifice layer-etching, the structure body for forming a micromachine is referred to as a final structure body here. In addition, the structure body of FIG. 5C is the one obtained by carrying out the sacrifice layer-etching to the structure body of FIG. 5B.

The above process for manufacturing a structure body shows the simplest example. Therefore, for example, a first conductive layer can be formed over a protective layer as a base, which is formed over a substrate. By forming the protective layer over the substrate, the structure body can be prevented from being contaminated due to an impurity from the substrate, or inner stress of other layer formed over the substrate can be relieved. As the protective layer, silicon oxide, silicon nitride, silicon nitride containing oxygen (also referred to as silicon nitride oxide), silicon oxide containing nitrogen (also referred to as silicon oxynitride), or the like can be used. It is to be noted that the protective layer may also have a stacked layer structure using the above materials. For example, as the protective layer, silicon oxide containing nitrogen can be formed by a plasma CVD method so as to have a thickness of more than or equal to 50 nm and less than or equal to 200 nm (preferably, more than or equal to 100 nm and less than or equal to 150 nm).

In addition, it is also possible to form the sacrifice layer 203 over a layer serving as a protective layer, which is formed over the first conductive layer 202. Furthermore, it is also possible to form layers serving as a protective layer above and below the second conductive layer 204, and form each of the conductive layer and the insulating layer not only as a single layer but also as a stacked layer. By forming protective layers over the first conductive layer 202 and below the second conductive layer 204, deterioration on the conductive layer surface in the sacrifice layer-etching can be prevented. In addition, by forming the structure layer by stacking the second conductive layer and the protective layer, inner stress of the structure layer can be relieved and hardness of the structure layer can be arbitrarily controlled.

From necessity in operation, the structure body is formed by sequentially stacking a fixed electrode (the first conductive layer) which is fixed to the substrate 201 and not moved, the sacrifice layer, and a movable electrode (the second conductive layer) which is moved as the structure layer in many cases. In the present invention, a thickness of the sacrifice layer is measured by utilizing this structure. Here, "the fixed electrode" and "the movable electrode" are thus called to show that the electrode is moved mechanically or fixed to the substrate or the like, and not shows that a potential applied to the electrode is fixed.

In addition, as shown in the example of FIG. 5D, the first conductive layer 202, the sacrifice layer 203, and the second conductive layer 204 are formed to overlap with one another, and an area S of a portion 207 where the first conductive layer 202 and the second conductive layer 204 overlap with each other is to be already known at a time of designing.

The structure body which is formed as described above can be regarded as a parallel plate type capacitor where the first conductive layer and the second conductive layer face each other, and an insulator is provided therebetween. Therefore, a test circuit in which an antenna and a structure body are connected as a closed circuit is to be a resonance circuit in which an inductor and a capacitor are connected through a resistor. Here, resistance is parasitic resistance generated due to a wiring which connects an antenna and a structure body.

The antenna is manufactured so as to have an inductance L which resonates at a certain frequency with a capacitance value of a structure body, which is expected at a time of designing. In addition, a resistance value R of parasitic resistance can be obtained from peculiar resistivity of a wiring material, and a cross-sectional area and a length of a wiring.

When an electromagnetic wave is emitted from a test device to a test circuit manufactured as described above, an induced electromotive voltage V is generated on both ends of the antenna. When a frequency of the electromagnetic wave is changed here, the electromagnetic wave is most absorbed at a frequency $f_0$ at which the test circuit including the antenna, the resistor, and the capacitor (structure body) is resonated, and a current i which flows in the test circuit becomes maximum.

Figure 6:
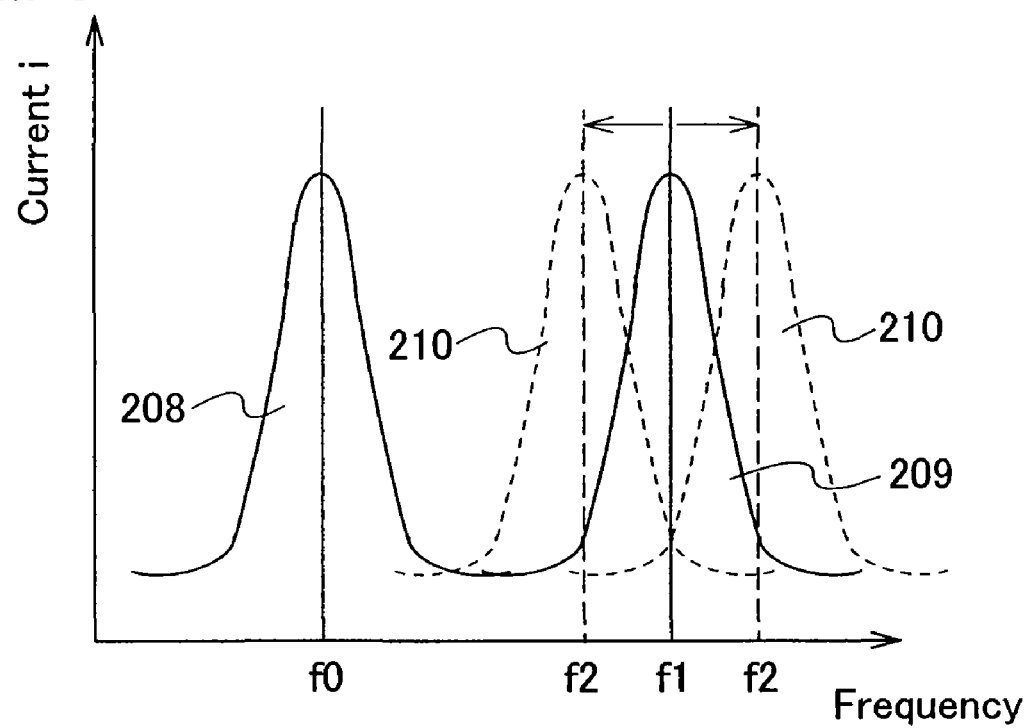
FIG. 6 is a graph explaining a response example of a test circuit.

FIG. 6 shows a frequency characteristic of the current i which flows in the test circuit as described above. The test circuit is a resonance circuit of the inductor, the capacitor, and the resistor; thus, the current i is indicated by a curve which has a peak with a certain frequency in center. In a frequency characteristic 208 of a current before sacrifice layer-etching, a current value has a peak with a frequency $f_0$ in center as shown in FIG. 6.

Since the antenna of the test circuit generates an electromagnetic wave that is proportional to a change over time of the current i which flows in the test circuit, a frequency characteristic of the current which flows in the test circuit can be obtained by receiving the electromagnetic wave by the test device.

Here, the resonance frequency $f_0$ of the test circuit can be expressed by an equation (1). In addition, the capacitance C of the structure body can be expressed by an equation (2).

[Equation 1]

$$f_0 = \frac{1}{2\pi\sqrt{L \cdot C}} \quad (1)$$

[Equation 2]

$$C = \frac{\varepsilon \cdot \varepsilon_0 \cdot S}{d} \quad (2)$$

In such a manner, the resonance frequency $f_0$ of the test circuit is determined by the inductance L, the resistance R, and the capacitance C of the structure body. The inductance L, the resistance R, the area S where the two conductive layers overlap with each other, and a relative dielectric constant $\varepsilon$ of the sacrifice layer are known at a time of designing or manufacturing. Therefore, a thickness of the sacrifice layer can be obtained from the resonance frequency $f_0$ of the test circuit. This method can be applied to both the structure bodies shown in FIGS. 5A and 5B.

Subsequently, also after the sacrifice layer is removed by sacrifice layer-etching, the resonance frequency can be similarly measured. When the resonance frequency at this time is set to be f1, a height of a space, i.e. a distance between two conductive layers, can be obtained by measuring the frequency f1 from the equations (1) and (2).

FIG. 6 shows a frequency characteristic 209 of the current i of the test circuit after sacrifice layer-etching. In the frequency characteristic 209 of the current after sacrifice layer-etching, a current value has a peak with a frequency f1 in center as shown in the graph. Since the relative dielectric constant of the space can approximate to 1 after the sacrifice layer-etching, in the case where distances between the two conductive layers before and after the sacrifice layer-etching are equivalent, the resonance frequency of the test circuit can be expressed by an equation 3.

[Equation 3]

$$f_1 = \frac{\sqrt{d}}{2\pi\sqrt{L}\cdot\sqrt{\varepsilon_0\cdot S}} = \sqrt{\varepsilon}\cdot f_0 \quad (3)$$

However, when a thickness d of the sacrifice layer before sacrifice layer-etching is changed to be a distance d±Δd between the two conductive layers after the sacrifice layer-etching, the resonance frequency can be expressed by an equation (4) (a resonance frequency at this time is to be $f_2$).

[Equation 4]

$$f_2 = \frac{\sqrt{d \pm \Delta d}}{2\pi\sqrt{L}\cdot\sqrt{\varepsilon_0\cdot S}} \quad (4)$$

Therefore, as shown in FIG. 6, a frequency characteristic 210 of a current which flows in the test circuit has a peak at $f_2$ at which a frequency is shifted from $f_1$ to a minus side or a plus side.

By employing the present invention as described above, a thickness of the sacrifice layer and a height of the space can be tested by using the same test circuit before and after sacrifice layer-etching. Then, by comparing those test results, a characteristic of a structure body can be evaluated for each process. In addition, when the same structure body is tested before and after the sacrifice layer-etching, and for example, in the case where a thickness of a sacrifice layer and a height of a space are different when comparing the results, distortion of the structure layer can be detected, and it becomes possible to evaluate a characteristic of the structure layer, such as inner stress or a spring constant.

Here, when the sacrifice layer is formed using a conductive material, a structure body before sacrifice layer-etching cannot be regarded as a capacitor, and the above method cannot be used. However, when the structure body is regarded as a resistor, the test circuit becomes a resonance circuit in which an inductor and a resistor are connected; thus, a thickness can be measured without contact by using a different method from the above method. Here, since a resistance value of the structure body reflects a thickness of the sacrifice layer, the thickness can be tested by obtaining a current-voltage characteristic of the structure body.

As in the above case, the overlapping area S of the two conductive layers forming the structure body and resistivity ρ of the sacrifice layer are known at a time of designing and manufacturing. The test device emits an electromagnetic wave in which a frequency is constant and output intensity is changed to the test circuit. A resistance value of the structure body is obtained by a response of the test circuit corresponding to a change in output intensity, and thus, a thickness of the sacrifice layer can be obtained. Here, in order to enhance test precision, a frequency of the electromagnetic wave that is emitted from the test device is preferably a resonance frequency of the test circuit.

In addition, as described in the above embodiment mode, evaluation of a characteristic of the structure body using the above test circuit can also be carried out by comparing measurement results using a structure body which serves as a reference. For example, a structure body having a known thickness is measured under a certain condition. Thereafter, a structure body which is desired to be tested is measured under the same condition; thus, evaluation can be carried out by comparing a result thereof with a measurement result of the structure body having a known thickness.

A surface micromachine is manufactured by forming and processing a thin film over a substrate, but inner stress is generated by forming a thin film over a different material. By carrying out sacrifice layer-etching, an adjacent film (sacrifice layer) is removed and inner stress is released in the thin film forming the structure body, and thus, a portion that is not in contact with the substrate becomes concave or convex. In such a manner, when the film forming the structure body is transformed, a height of a space is changed; therefore, a characteristic of the structure body is greatly changed. Therefore, by measuring the height of the space, the characteristic of the structure body can be roughly estimated, or the structure body can be determined to be defective or not defective.

As in the present invention, by measuring the structure body without contact, the structure body can be easily evaluated without being broken. Furthermore, by testing a characteristic of the structure body by electromagnetic wave intensity or a frequency characteristic, a state that cannot be seen by a microscope, like a thickness of a film below a metal film can also be tested. When a thickness of a film that is provided below an opaque film is measured, the thickness is generally measured by observing a cross-section of a divided substrate. However, by employing the present invention, measurement can be easily carried out, and the substrate can be returned to the process after the test. Accordingly, it is not necessary to throw away the substrate, and productivity can be improved.

By employing the present invention as described above, a thickness of a sacrifice layer and a height of a space can be tested by using the same test circuit before and after sacrifice layer-etching; therefore, a characteristic of a structure body can be evaluated for each process. Accordingly, a probability of repairing a defect that is found can be increased and productivity can be improved when a process is tested before sacrifice layer-etching or before dicing. In addition, by testing the same structure body before and after sacrifice layer-etching and comparing the results, a characteristic (stress or the like) of a layer forming the structure layer can be evaluated.

It is to be noted that this embodiment mode can be implemented by being freely combined with the above embodiment mode.

Embodiment Mode 3

As for the test method described in the above embodiment mode, this embodiment mode will describe an example of a structure of a different test circuit, and a test method using the circuit. The test method according to the present invention can also be applied to a test circuit shown in FIGS. 7A to 7C.

Figure 7A:
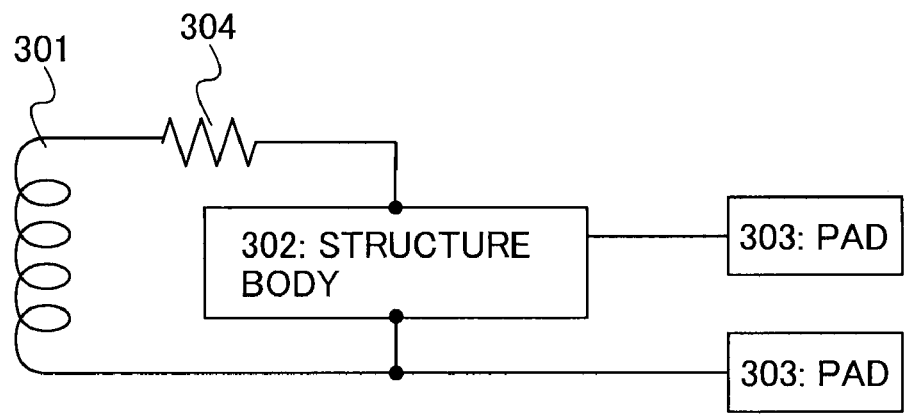
FIGS. 7A to 7C are diagrams each explaining a measuring method of a micromachine according to the present invention.
Figure 7B:
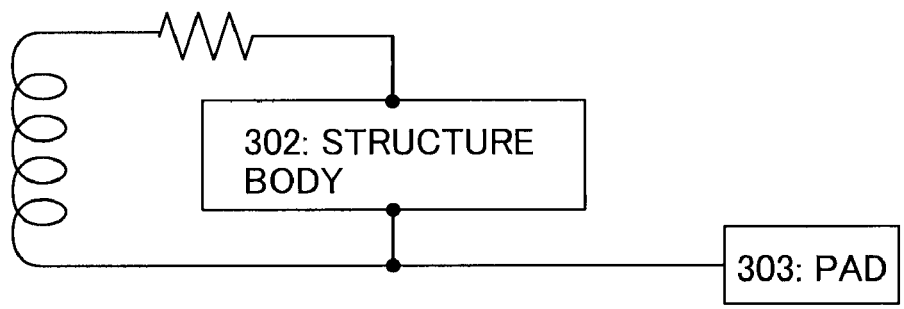
Figure 7C:
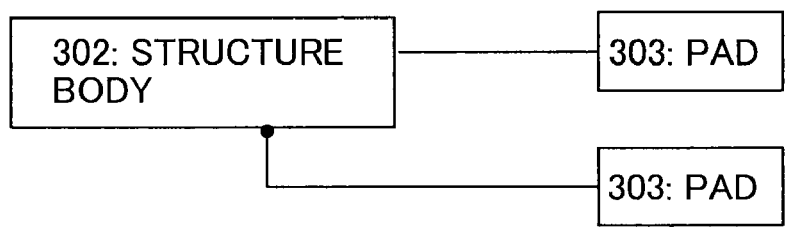

Each of test circuits shown in FIGS. 7A and 7B includes an antenna 301, a structure body 302, and a measuring pad 303. A resistor 304 denotes wiring resistance of the test circuit. In FIG. 7C, the test circuit includes the structure body 302 and the measuring pad 303. In this test circuit, the antenna and the structure body are connected so as to form a closed circuit, and the pad is connected to the same node as that of a conductive layer forming the structure body. A place and the number of connecting pads can be determined in accordance with an object to be measured.

In the case of using this test circuit, electric power is supplied by making a needle of a prober be in contact with the pad, and a characteristic of the structure body can be tested by receiving a generated electromagnetic wave from the antenna. On the other hand, it is also possible to measure a current which flows in the structure body and a voltage that is applied by supplying electric power wirelessly from the test device to the test circuit through the antenna 301 and making a needle of a prober be in contact with the pad.

Here, an example of a measuring method of a thickness of a sacrifice layer by employing the latter method is shown. Each of the test circuits in FIGS. 7A to 7C has the structure body shown in FIG. 5B, and has two pads which are respectively connected to the same node as that of a first conductive layer of the structure body and the same node as that of a second conductive layer. When an electromagnetic wave is emitted from the test device to this test circuit, an induced electromotive voltage is generated in the antenna 301. When a frequency of the electromagnetic wave is changed, the electromagnetic wave is most absorbed at a resonance frequency of the test circuit, and thus, a generated induced electromotive voltage becomes maximum. By making a needle of a prober be in contact with the pad and measuring a frequency characteristic of the voltage that is applied to the structure body, a resonance frequency of the test circuit can be obtained. As described in Embodiment Mode 2, a thickness of the sacrifice layer can be evaluated from the resonance frequency.

By carrying out the above measurement before and after sacrifice layer-etching, it is possible to compare a thickness of the sacrifice layer and a height of the space (a distance between the two conductive layers) of the structure body and evaluate a characteristic of the layer forming the structure layer (stress or the like). Here, the space of the structure body is formed by removing the sacrifice layer between the first conductive layer and the second conductive layer as described in the above embodiment mode.

In addition, when a test is carried out by applying an alternating-current voltage and a reference voltage (such as a grounding voltage or a constant voltage) to the test circuit, the test circuit shown in FIG. 7B can be employed. The test circuit shown in FIG. 7B has an antenna, a structure body, and one pad that is connected to part of the structure body. For example, a constant voltage can be supplied to a first electrode of the structure body through the pad, and electric power can be supplied through the antenna. By carrying out such operation, a mechanical resonance frequency of the structure body can be obtained. Therefore, a characteristic, such as whether the sacrifice layer is completely removed by sacrifice layer-etching, film stress of the structure layer, or a spring constant, can also be obtained. This is because the above characteristic depends on the mechanical resonance frequency of the structure body.

In addition, it is also possible to test a thickness of the sacrifice layer or whether the sacrifice layer is removed by a contact-test method using the test circuit shown in FIG. 7C. The test circuit shown in FIG. 7C includes a structure body, a pad that is connected to the same node as that of a first conductive layer of the structure body, and a pad that is connected to the same node as that of a second conductive layer of the structure body. In the test circuit as described above, alternating-current electric power is supplied from the pad, and frequency dependency and intensity dependency are measured; thus, a test can be carried out.

When the above test method is applied to the structure bodies shown in FIGS. 5A to 5D, it is possible to test the process without breaking the substrate, that is, without observation using a SEM (Scanning Electron Microscope) by dividing the substrate. Further, the substrate after the test can be returned to the process, and thus, productivity can be improved.

In addition, as described in the above embodiment mode, characteristic evaluation of the structure body using the above test circuits shown in FIGS. 5A to 5D can also be carried out by comparing measurement results using a reference structure body. For example, when it is difficult to obtain the thickness from frequency dependency of a voltage, a structure body having a known thickness is measured by the above method. Thereafter, a structure body that is desired to be tested is measured under the same condition, and evaluation can be carried out by comparing a result thereof with a measurement result of the structure body having a known thickness.

In such a manner, by testing a characteristic of a structure body by electromagnetic wave intensity and a frequency characteristic, a state that cannot be easily seen by a microscope, like a thickness of a film below a metal film can also be tested. In addition, by testing a process before sacrifice layer-etching or before dicing, a probability of repairing a defect that is found can be increased, and productivity can be improved.

It is to be noted that this embodiment mode can be implemented by being freely combined with the above embodiment modes.

Embodiment Mode 4

This embodiment mode will describe a test method of a micromachine using a test circuit which has a power supply circuit. A power supply circuit has a function of generating a constant voltage from an alternating-current voltage and can supply constant voltage-electric power to a structure body. Therefore, when a test circuit has a power supply circuit, various characteristics of a structure body can be measured.

Figure 8A:
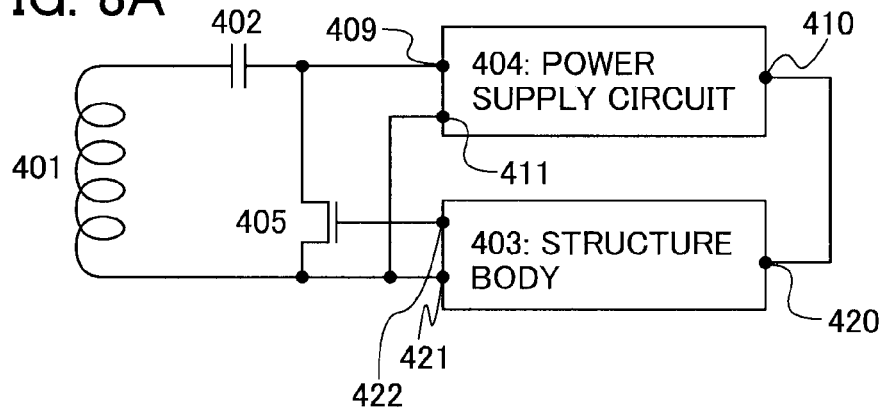
FIGS. 8A to 8C are diagrams each explaining a measuring method of a micromachine according to the present invention.
Figure 8B:
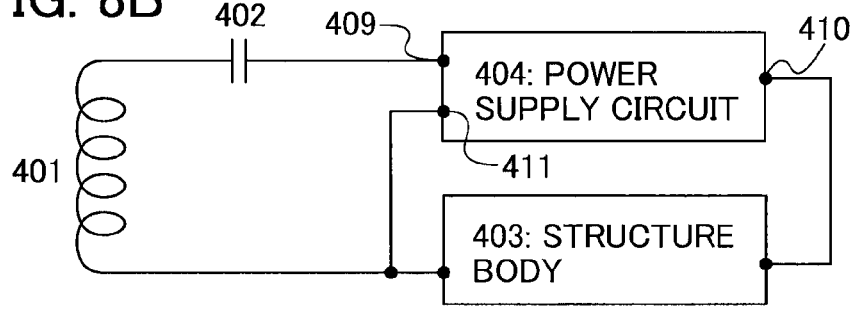
Figure 8C:
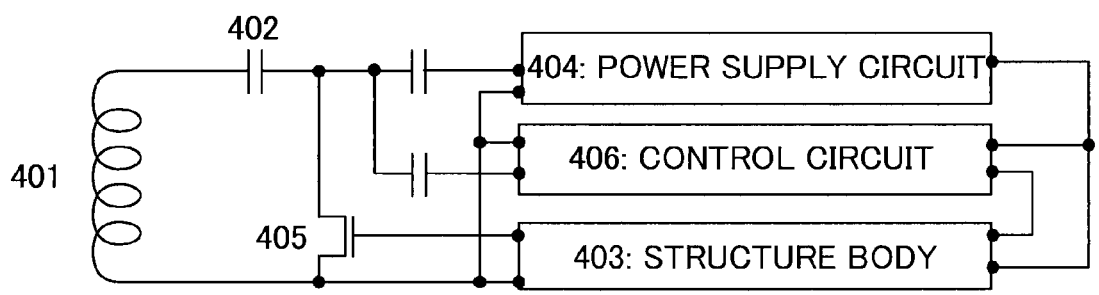

FIGS. 8A to 8C each show a structural example of a test circuit. A test circuit of FIG. 8A includes an antenna 401, a capacitor 402, a structure body 403, a power supply circuit 404, and a switching element 405. Here, the switching element is a three-terminal element like a transistor having an input terminal, an output terminal, and a control electrode and is an element which can control whether the input terminal and the output terminal are connected (ON or OFF) by the control electrode. It is to be noted that a thin film transistor can be used as the switching element. The thin film transistor may be either a top gate type or a bottom gate type.

The structure body 403 can have various structures depending on its shape. Here, as an example, the structure body 403 has two input terminals 420 and 421, and one output terminal 422. In addition, the power supply circuit 404 has one input terminal 409 and two output terminals 410 and 411. In the test circuit, the antenna 401, the capacitor 402, and the switching element 405 are connected so as to form a closed circuit, the capacitor 402 and the switching element 405 are both connected to the input terminal 409 of the power supply circuit 404, and the output terminal 422 of the structure body 403 is connected to the control electrode (a gate electrode in the case where the switching element is a transistor) of the switching element 405.

In this test circuit, the antenna 401 and the capacitor 402 absorb an electromagnetic wave emitted from a test device at a specific resonance frequency and generate high induced electromotive force. The induced electromotive force is supplied to the input terminal 409 of the power supply circuit 404, and the power supply circuit generates a constant reference voltage by rectifying the induced electromotive force and a constant voltage higher than the reference voltage. Here, the reference voltage is a reference voltage in the test circuit and is generally referred to as an earth-grounded voltage, grounding, or the like, but is referred to as a reference voltage in this specification. In addition, the power supply circuit generates a constant voltage higher than the reference voltage, and this voltage is referred to as a power supply voltage in this specification. In other words, the power supply circuit generates the power supply voltage and the reference voltage, outputs the power supply voltage from the output terminal 410, outputs the reference voltage from the output terminal 411, and supplies these voltages to the entire test circuit including the structure body 403.

The structure body 403 operates by electric power supplied from the power supply circuit 404 and outputs a change in voltage in accordance with an operating characteristic to the switching element 405. When the switching element 405 is turned on or off by output of the structure body 403, impedance which accompanies the antenna 401 and the capacitor 402 changes, and the antenna outputs an electromagnetic wave which reflects an operating characteristic of the structure body. By receiving the electromagnetic wave outputted from the antenna by the test device, a characteristic of the structure body 403 can be evaluated.

In addition, as shown in FIG. 8B, a test circuit can also include an antenna 401, a capacitor 402, a power supply circuit 404, and a structure body 403. In other words, the test circuit does not include a switching element, and an input terminal 409 of the power supply circuit is connected to the antenna 401 through the capacitor 402. As in the above case, the power supply circuit 404 generates a power supply voltage and a reference voltage, outputs the power supply voltage from an output terminal 410, outputs the reference voltage from an output terminal 411, and supplies these voltages to the structure body 403. In addition, the output terminal 411 of the power supply circuit 404 is connected to one end of the antenna, to which the capacitor 402 is not connected.

The test circuit shown in FIG. 8A has a structure in which an electromagnetic wave in accordance with an operating characteristic of the structure body is outputted depending on ON and OFF of the switching element; thus, this test circuit can be employed in the case where output from the structure body is digital. For example, this test circuit can be employed in the case where the structure body has a switching function and tests the ON and OFF characteristics. On the other hand, in the test circuit shown in FIG. 8B, the antenna 401 is directly connected to the output terminal of the structure body 403. In the test circuit shown in FIG. 8B, an electromagnetic wave in accordance with a change in voltage of the output terminal of the structure body can be outputted. Therefore, this test circuit can be employed in the case where output from the structure body is analog, for example, in the case where the structure body is a variable capacitor and a change in variable capacitance is tested.

Further, as shown in FIG. 8C, a test circuit can also include an antenna 401, a capacitor 402, a switching element 405, a power supply circuit 404, a control circuit 406, and a structure body 403. The antenna 401, the capacitor 402, and the switching element 405 are connected so as to from a closed circuit, and the power supply circuit 404 and the control circuit 406 are connected to one end of the antenna 401 through the capacitor 402. The power supply circuit rectifies an alternating-current voltage as in the above case, and the rectified electric power is supplied to the control circuit and the structure body. In addition, a grounding potential generated in the power supply circuit is connected to the other end of the antenna.

The control circuit 406 has a function of controlling the structure body 403 by taking out a control signal transmitted from a test device from an electromagnetic wave received by the antenna 401. The structure body controlled by the control circuit 406 outputs an operating characteristic thereof to a control electrode of the switching element. Since the switching element is turned on or off depending on output of the structure body, impedance which accompanies the antenna and the capacitor changes, and the antenna outputs an electromagnetic wave which reflects output of the structure body.

In the test circuit of FIG. 8C, the switching element is not required to be provided, and a terminal of the structure body may be connected to one end of the antenna.

Figure 9A:
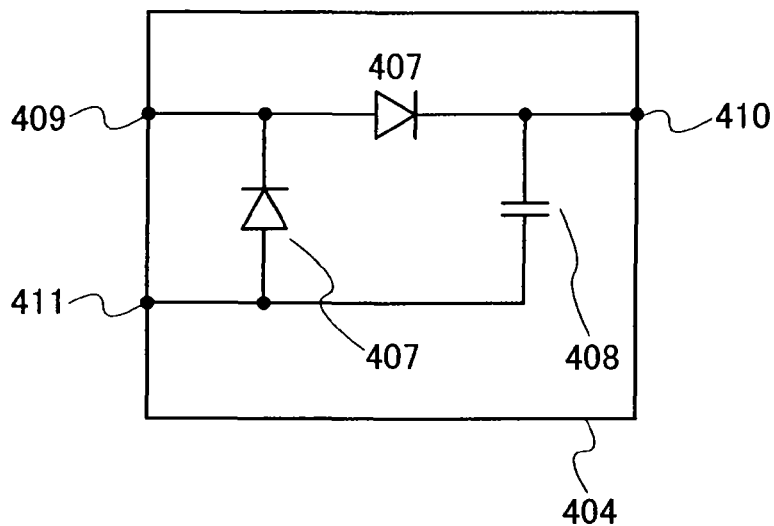
FIGS. 9A and 9B are diagrams each explaining a power supply circuit.

Subsequently, the power supply circuit 404 included in the test circuit will be described with reference to FIGS. 9A and 9B. As shown in FIG. 9A, the power supply circuit 404 includes a diode 407 and a capacitor 408, and rectifies an alternating-current voltage inputted from an input terminal 409 which is connected to the antenna into a constant voltage. The rectified power supply voltage is outputted from an output terminal 410 to each unit in the test circuit. In addition, the power supply circuit 404 generates a reference voltage at the same time as generates a power supply voltage, which is outputted from an output terminal 411, and supplied to the antenna and a structure layer.

In the power supply circuit 404 shown here, one of the two diodes 407 is connected in a forward direction to rectify a voltage, and the other is connected in a reverse direction to form a circuit so that back-flow is prevented. However, it is also possible to form a power supply circuit by using two or more diodes to perform rectification and prevention of back-flow. In addition, the power supply circuit 404 is formed by using the diode 407 and the capacitor 408 here but can also be formed by using a passive element such as an inductor.

Figure 9B:
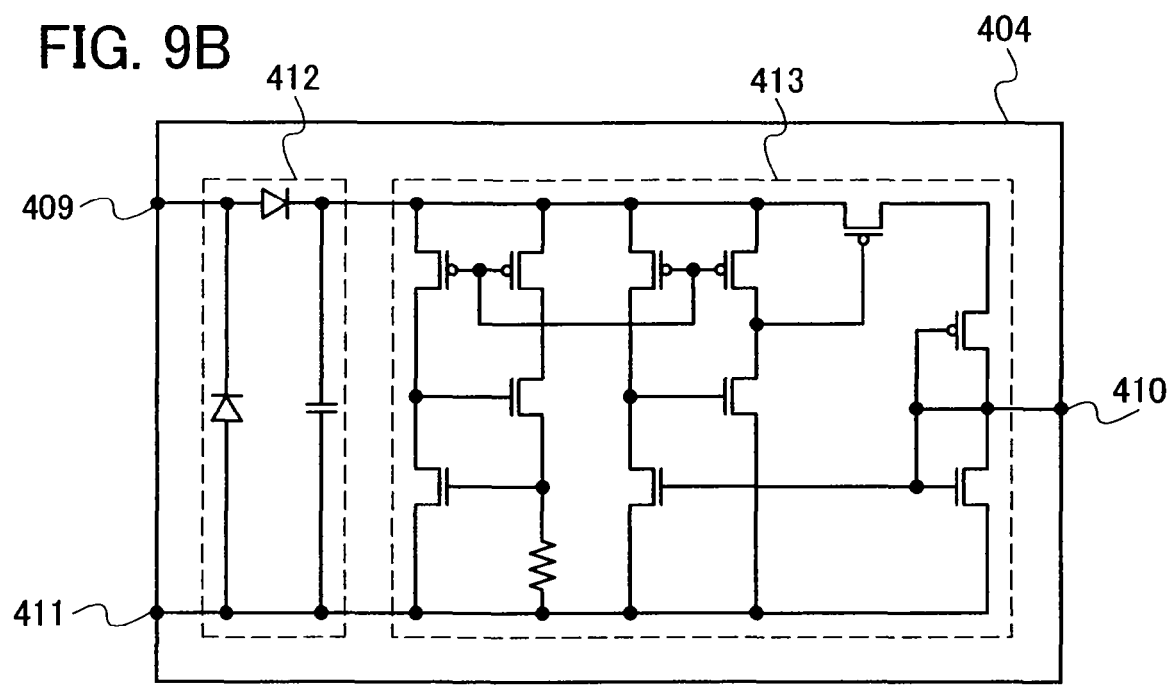

In addition, as shown in FIG. 9B, the power supply circuit 404 can also include a rectifying circuit 412 and a regulator 413. Similarly to the power supply circuit 404 as described above, the rectifying circuit 412 rectifies an alternating-current voltage supplied from an input terminal 409 which is connected to the antenna. The regulator 413 keeps a voltage generated by the rectifying circuit 412 a certain constant voltage. Therefore, the power supply circuit 404 outputs the voltage which is kept to be a constant value by the regulator 413 and a reference voltage to each unit in the test circuit from output terminals 410 and 411.

When electric power of the electromagnetic wave emitted from the test device is high, the rectifying circuit generates a high voltage and supplies the high voltage to the structure body, and the structure body is broken in some cases. In such a case, by providing the regulator in the power supply circuit, a predetermined power supply voltage can be supplied to the structure body.

On the other hand, when it is desired to supply a high voltage to the structure body, the power supply circuit can include a boosting circuit. The boosting circuit can be formed by using a diode and a capacitor. When the power supply circuit has a boosting circuit, a high voltage which cannot be generated in the power supply circuit or a negative voltage can be generated and supplied to the structure body.

By providing the power supply circuit as described above in the test circuit, a power supply voltage can be supplied to the structure body; therefore, a static characteristic of the structure body can be measured wirelessly. In addition, when the test circuit has a power supply circuit, a characteristic of the structure body, such as a thickness of a sacrifice layer, a height of a space, film stress of a structure layer, a spring constant of the structure layer, a resonance frequency of the structure layer, or a drive voltage of the structure body, can be measured.

Figure 10A:
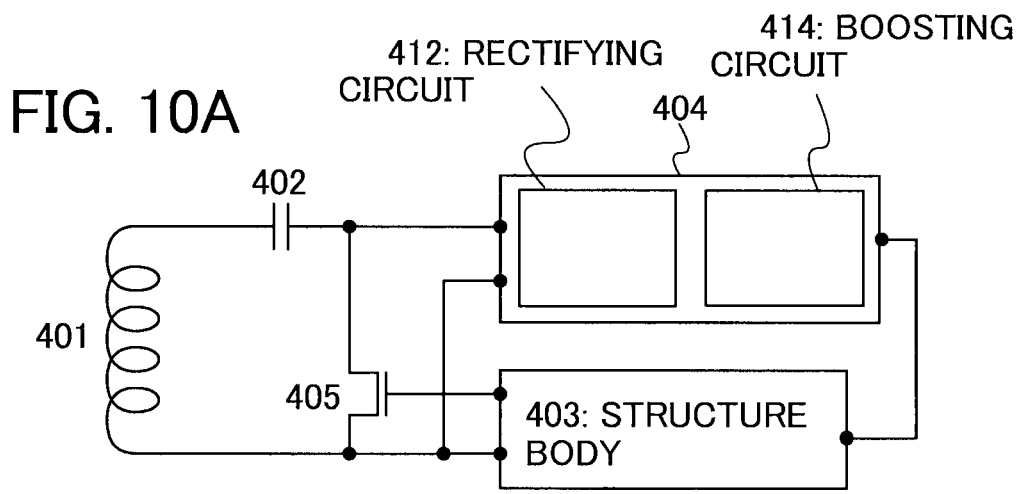
FIG. 10A is a diagram.

Then, a measuring method of a drive voltage of a structure body by using a test circuit shown in FIG. 10A will be described. As shown in the drawing, the test circuit includes an antenna 401, a capacitor 402, a structure body 403, a power supply circuit 404, and a switching element 405, and the power supply circuit 404 includes a rectifying circuit 412 and a boosting circuit 414.

Figure 10B:
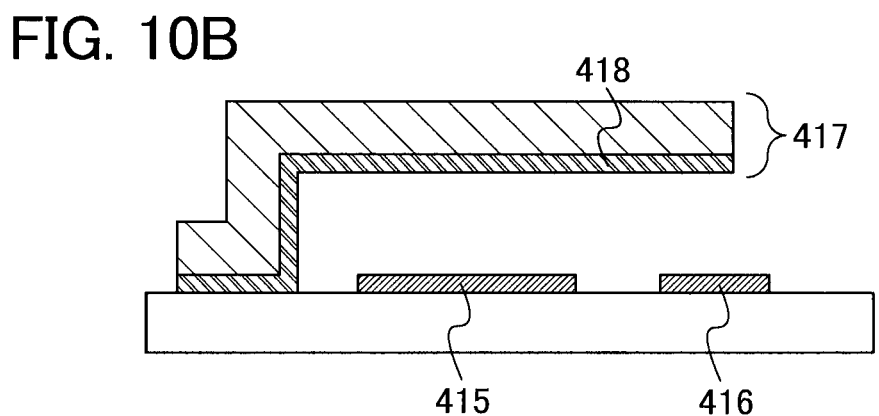
FIG. 10B is a view.

As shown in FIG. 10B, the structure body of the test circuit includes, over a substrate, a first conductive layer 415, an output terminal 416, and a structure layer 417. The structure layer 417 includes a second conductive layer 418 which faces the first conductive layer 415. Part of the structure layer 417 is supported by the substrate, and other part faces the substrate through a space. When a voltage is applied between the first conductive layer 415 and the second conductive layer 418 of the structure body 403, the structure layer 417 is moved to be drawn to the substrate. As a higher voltage is applied, the structure layer 417 is drawn to the substrate so that the first conductive layer 415 is in contact with the second conductive layer 418. A voltage at this time is referred to as a pull-down voltage. Here, a test method of a pull-down voltage, as an example of the drive voltage of the structure body, will be described.

In the power supply circuit 404, an input terminal is connected to one end of the antenna through the capacitor 402; a power supply voltage is generated from an alternating-current induced electromotive voltage, which is generated in the antenna, by the rectifying circuit 412; a high voltage is generated by the boosting circuit 414; and the high voltage is supplied to the second conductive layer of the structure body. In addition, a reference voltage generated in the power supply circuit is supplied to one end of the antenna and the first conductive layer of the structure body. Here, as higher electric power is supplied to the test circuit by a test device, a power supply voltage generated by the rectifying circuit gets higher. Therefore, the boosting circuit, which generates a high voltage based on the power supply voltage, outputs a high voltage that is proportional to the power supply voltage.

In addition, the output terminal which is provided in the same layer as that of the first conductive layer of the structure body is connected a control electrode of the switching element and is not conducted to the first conductive layer. When a reference voltage is supplied to the first conductive layer of such a structure body and a high voltage generated in the power supply circuit is supplied to the second conductive layer, the structure layer is moved as described above, and the second conductive layer is in contact with the first conductive layer and the output terminal. When the output terminal is in contact with the second conductive layer, operation of the switching element changes, and impedance which accompanies the antenna and the capacitor changes.

Figure 10C:
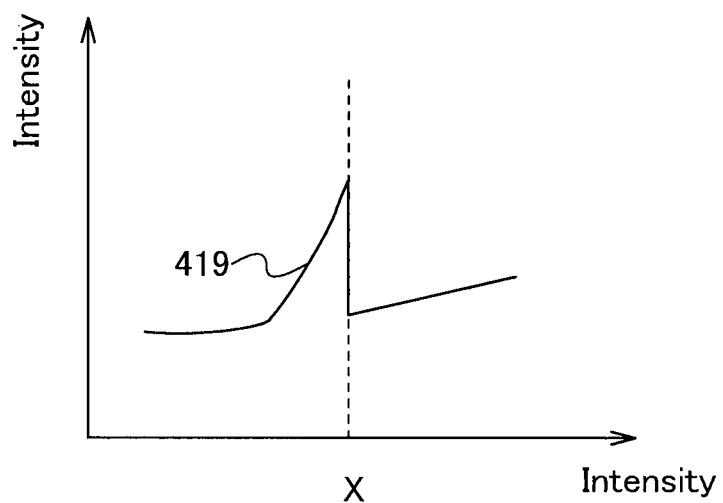
FIG. 10C is a graph, each explaining a measuring method of a micromachine according to the present invention.

Here, when a curve 419 is drawn, where a horizontal axis indicates intensity of an electromagnetic wave emitted from the test device and a vertical axis indicates intensity of an electromagnetic wave outputted from the test circuit, it is understood that intensity of an electromagnetic wave outputted from the test circuit is changed at a certain point X of the horizontal axis as shown in FIG. 10C. This point shows a pull-down voltage.

When a height of a space of a structure body is tested by the method described in the above embodiment mode and a pull-down voltage is tested in the above described manner, a characteristic of the structure layer included in the structure body can be evaluated. For example, a pull-down voltage is determined by a height of a space, and a shape and stress of the structure layer. Therefore, by carrying out these tests, stress of a layer included in the structure layer can be evaluated.

Further, by using the test circuit having the power supply circuit and the like, a method will be described with reference to FIGS. 2A and 2B, which tests whether a sacrifice layer is completely removed by sacrifice layer-etching or a sacrifice layer is left by insufficient sacrifice layer-etching. It is to be noted that FIG. 2A shows a structure body having a cantilever structure, and FIG. 2B shows a structure body having a beam structure which is formed into a bridge shape.

Figure 2A:
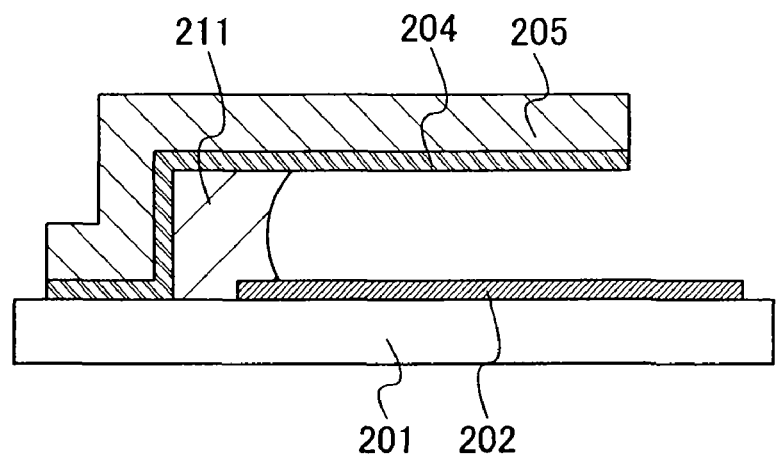
FIGS. 2A and 2B are views each explaining a defect generated in sacrifice layer-etching.

For example, as shown in FIG. 2A, when the structure body having a cantilever structure is tested, a constant voltage is applied to a first conductive layer 202, and a high frequency voltage is supplied to a second conductive layer 204. This test can be carried out by using, for example, the test circuit described in Embodiment Mode 3 in FIG. 7B. When the length of the beam is to be known at a time of designing and manufacturing, the beam is resonated at a resonance frequency of the structure body. However, when there is a remainder 211 of a sacrifice layer (a sacrifice layer that is not removed even by sacrifice layer-etching and left), the length of the beam is changed and not resonated at the above frequency (more in detail, the substantial length of the beam is shortened by the remainder 211 of the sacrifice layer, and thus, a resonance frequency gets higher). By measuring the resonance frequency, it is possible to test whether there is a remainder of the sacrifice layer.

Further, as described above, by measuring a pull-down voltage, it is also possible to test whether there is the remainder of the sacrifice layer. In that case, a characteristic that a pull-down voltage is determined by a structure of the structure body is utilized. In other words, in the case of the cantilever structure, a pull-down voltage is increased as the length of the beam gets shorter; therefore, by measuring the voltage change, it is possible to test whether there is the remainder of the sacrifice layer.

Figure 2B:
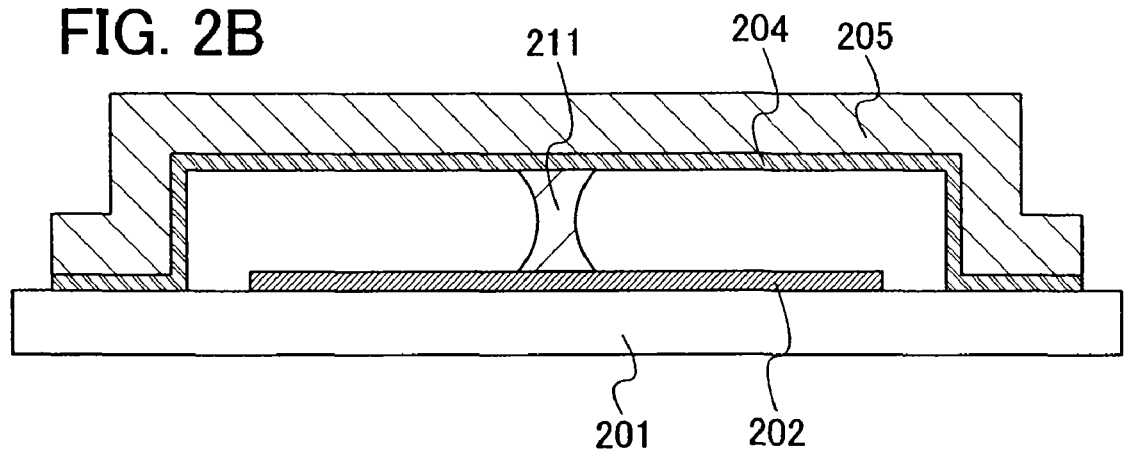

In addition, when there is too much remainder 211 of the sacrifice layer or the remainder 211 of the sacrifice layer is provided in the beam structure as shown in FIG. 2B, pull-down does not occur; accordingly, a test is also possible by utilizing this characteristic.

Further, either in the case of the cantilever structure (FIG. 2A) or the beam structure (FIG. 2B), the test can be carried out by utilizing a characteristic that impedance of the structure body changes, as in the test method described in Embodiment Mode 2. For example, in the case where the structure body has capacitive impedance (in other words, in the case where a sacrifice layer is formed using an insulating material having a dielectric constant $\in$), when there is a remainder of a sacrifice layer, capacitance of the structure body is a capacitance value in which a capacitor having a dielectric constant $\in$ (a vacuum dielectric constant) between the conductive layers and a capacitor having a dielectric constant $\in$ are connected in parallel. By utilizing this capacitance change, it is possible to test whether there is a remainder of the sacrifice layer. In addition, in the case where the structure body has resistive impedance (in other words, in the case where the sacrifice layer is formed using a conductive material), when the sacrifice layer is completely removed, the structure layer is not conductive. However, when there is a remainder of the sacrifice layer, the structure layer is conductive; thus, a test is possible.

Accordingly, by employing the above test method, it is possible to easily test whether the sacrifice layer is completely removed by using a simple means such as an optical microscope. In addition, the substrate after the test can be returned to the process. Therefore, productivity can be improved.

As described above, by providing a power supply circuit or a control circuit in a test circuit, it becomes possible to test various static characteristics or dynamic characteristics of a structure body, such as a thickness of a sacrifice layer, a height of a space, whether the sacrifice layer is removed, a mechanical resonance frequency of the structure body, a drive voltage of the structure body, and the like. In addition, from these test results, film stress of a structure layer, a spring constant of the structure body, or the like can be obtained. Further, since a test is possible without dividing the substrate, steps can be continuously carried out, and a defect can be repaired when it is found; therefore, productivity can be improved.

It is to be noted that this embodiment mode can be implemented by being freely combined with the above embodiment modes.

Embodiment Mode 5

This embodiment mode will describe a test method of a characteristic of a structure body by carrying out experimental sacrifice layer-etching to a substrate over which a micromachine and a structure body are manufactured. Here, an example of manufacturing a structure body having a shape shown in FIGS. 11A to 11C will be described.

In a manufacturing process of a structure body, first, a first conductive layer 502 that is to be a fixed electrode is formed over a substrate 501. The first conductive layer 502 is formed by depositing a conductive material such as metal or metal oxide by a sputtering method, a CVD method, or the like and by processing the conductive material into an arbitrary shape by a photolithography method or the like. Further, the first conductive layer 502 may be directly formed over the substrate 501 as shown in the drawing, or may also be formed over a first protective layer that is a base formed over the substrate.

Subsequently, a sacrifice layer 503 is formed over the first conductive layer 502. The sacrifice layer 503 can be formed by depositing a material suitable for the sacrifice layer and by processing the material into an arbitrary shape. Here, the material suitable for the sacrifice layer is, for example, a material which can be removed quickly in sacrifice layer-etching, can be thickly formed in a short time, and is easily processed. Obviously, it is important that the material has a selective ratio to other layer in sacrifice layer-etching. A thickness of the sacrifice layer 503 is, for example, more than or equal to 0.5 μm and less than or equal to 5 μm (for example, 2 μm).

Figure 11A:
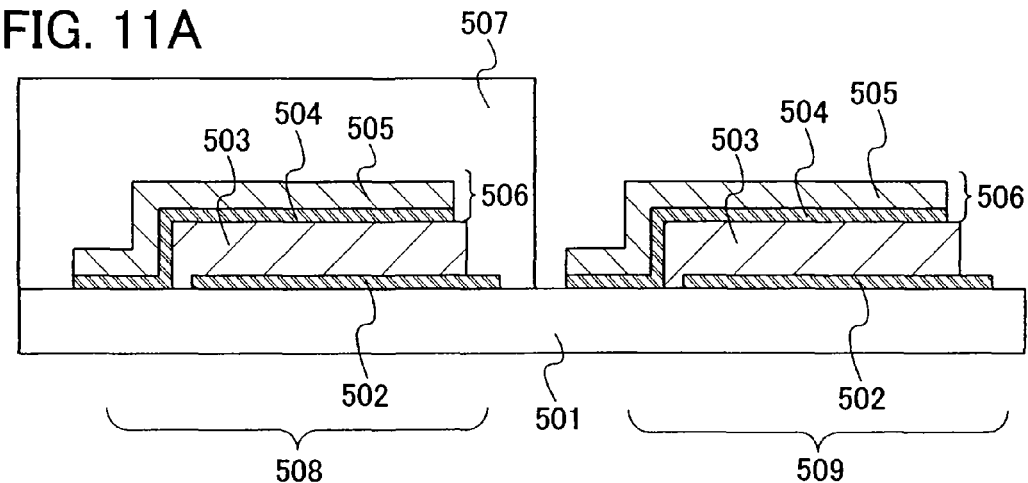
FIGS. 11A to 11C are views each explaining a measuring method of a micromachine according to the present invention.

Next, over the sacrifice layer 503, a second conductive layer 504 that becomes a movable electrode and a first insulating layer 505 are formed. Then, by processing the second conductive layer and the first insulating layer, a structure body shown in FIG. 11A is formed. Here, the second conductive layer and the first insulating layer form a structure layer 506. It is to be noted that these structures are examples, and for example, the structure layer may be formed by using only the second conductive layer, or the first insulating layer 505 may be a multilayer. In other words, it is preferable that all the layers such as the structure layer, the sacrifice layer, and the fixed electrode have various shapes and a stacked layer structure depending on a structure of a necessary structure body. It is to be noted that a thickness of the first insulating layer 505 is, for example, more than or equal to 500 nm and less than or equal to 3 μm (for example, 800 nm).

Figure 11B:
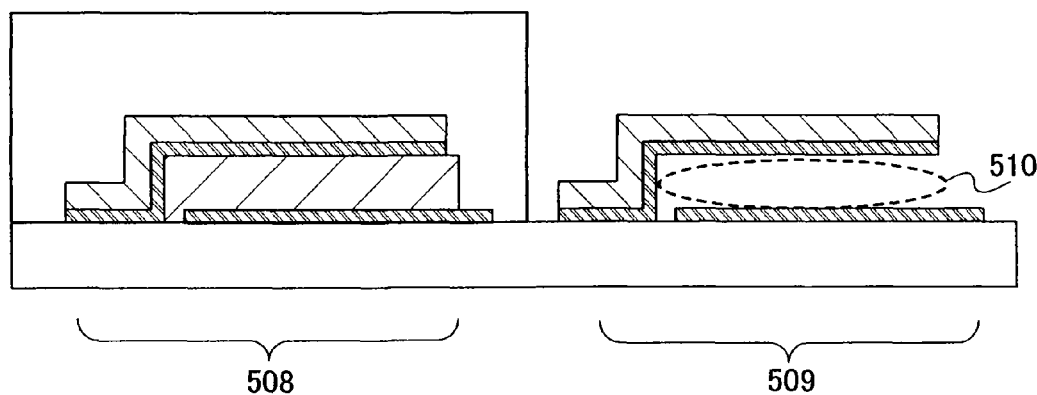
Figure 11C:
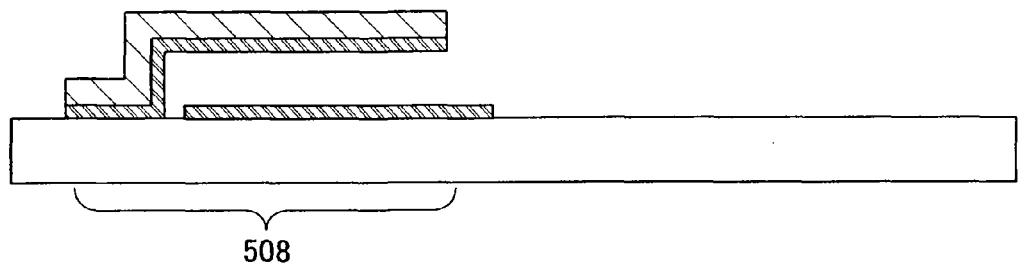

After the structure body is formed as described above, as shown in FIG. 11A, a second protective layer 507 is formed over a first structure body 508 which is not used in a test. In FIGS. 11A to 11C, the structure body 508 which is not used in a test is shown on the left side, and a structure body 509 for a test is shown on the right side. As shown in FIGS. 11A to 11C, the second protective layer 507 is not formed over the structure body 509 for a test.

Then, by carrying out sacrifice layer-etching, as shown in FIG. 11B, only the sacrifice layer of the structure body for a test is removed, and a space 510 is formed. In order to carry out sacrifice layer-etching, a sacrifice layer and an etching agent, which can have a selective ratio to the second protective layer as well as the first conductive layer and the structure layer, are used.

As described above, by forming the structure body for a test, it is possible to test the structure body previously over part of the substrate. A test can be carried out by using the test circuit and the test method described in the above embodiment modes. Further, by measuring a height of a space, a pull-down voltage which is obtained when a voltage is applied to the structure body and the first conductive layer is in contact with the second conductive layer, a natural frequency of the structure layer, and the like, it is possible to evaluate film stress of the structure layer, strain of the structure layer due to the film stress, an operating voltage of the structure body, and the like.

When it is evaluated that a characteristic of the structure body is in a range of a specification value at a time of designing and the structure body operates normally by such a test, the structure body 509 for a test and the second protective layer 507 are removed as shown in FIG. 11C. Thereafter, by carrying out sacrifice layer-etching to the structure body 508, the structure body for manufacturing a micromachine can be formed.

On the other hand, when a characteristic of the structure body is bad and a defective product may be produced after the process, the structure body can be repaired. The structure body can be repaired by removing the structure body for a test, the second protective layer, and the structure layer, and forming the structure layer again, for example.

As described above, in the present invention, a structure body can be tested by providing a structure body to be manufactured and a structure body for a test and previously carrying out sacrifice layer-etching only to the structure body for a test. In such a manner, when a test is carried out after sacrifice layer-etching by using the structure body for a test, in the case of a defective characteristic, the structure body over the substrate can be repaired, and productivity can be improved.

It is to be noted that this embodiment mode can be implemented by being freely combined with the above embodiment modes.

Embodiment Mode 6

As described in Embodiment Mode 4, when a test circuit includes a power supply circuit and a control circuit, it is possible to test characteristics of plural types of structure bodies or test a plurality of the same type structure bodies. This embodiment mode will describe such a test method with reference to FIGS. 12A and 12B.

In order to test a plurality of structure bodies, for example, a test circuit may be formed so as to include a plurality of structure bodies. Then, electric power and a control signal which controls the test circuit as needed are transmitted from a test device, and the test circuit may operate individual structure bodies and output the responses sequentially.

Figure 12A:
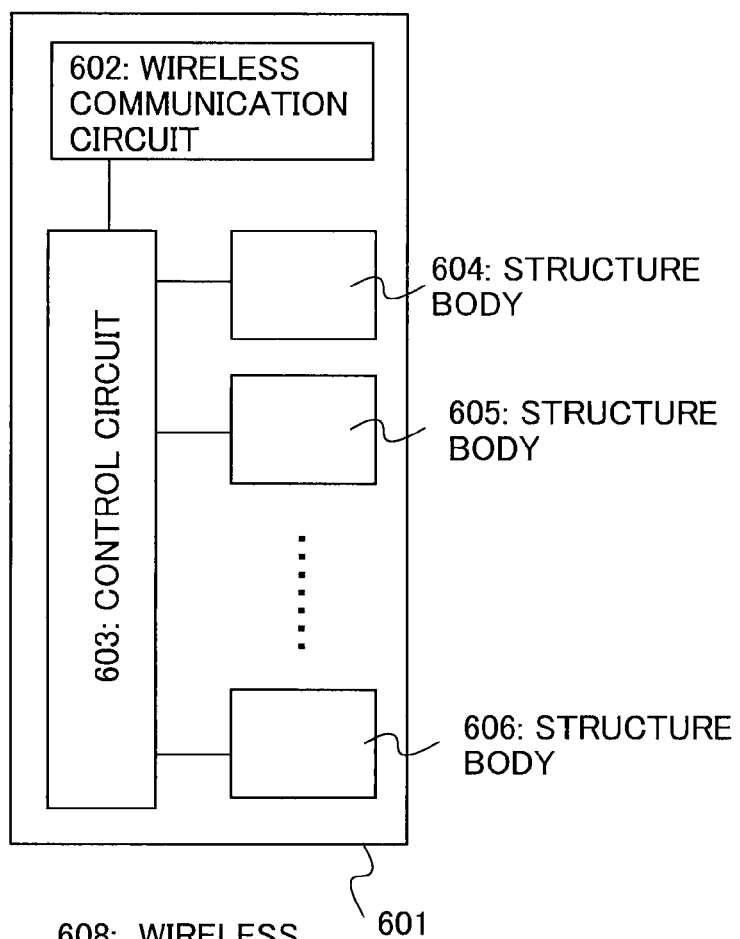
FIGS. 12A and 12B are diagrams each explaining a measuring method of a micromachine according to the present invention.

FIG. 12A shows an example of a test circuit for such a test. A test circuit 601 includes a wireless communication circuit 602, a control circuit 603, and a plurality of structure bodies 604 to 606. The wireless communication circuit includes an antenna, a capacitor, the power supply circuit described in the above Embodiment Mode 4, and the like. The antenna and the capacitor communicate with the test device, and the power supply circuit generates constant electric power and supplies the electric power to the circuit.

The control circuit includes a demodulating circuit, a frequency dividing circuit, a driver, and the like, and operates by electric power supplied from the power supply circuit. The demodulating circuit demodulates a control signal transmitted from the test device, and the frequency dividing circuit generates a clock signal of a necessary frequency. The driver receives the control signal, selects a structure body which is an object to be tested, and supplies electric power to the selected structure body. In addition, the control circuit transmits a response signal from the structure body to the wireless communication circuit.

When a circuit for selecting one structure body from the plurality of structure bodies is formed by using a driver, a control signal may be a start pulse which starts operation of the driver. In addition, this circuit can also be formed by using a decoder not the driver, and in that case, the control signal is to be an address signal.

The control circuit having the above configuration operates the plurality of structure bodies by sequentially selecting them one by one and transmits a response of the structure body to the wireless communication circuit as an output signal, and then, the wireless communication circuit outputs the output signal wirelessly. A period during which the control circuit selects the structure body can be arbitrarily determined in accordance with a structure of the driver or the decoder, or a clock signal supplied to the driver or the decoder. It is desirable that this selecting period be set to be time that is necessary and sufficient for testing the structure body. In addition, by the control circuit, after the test is carried out from the initial structure body 604 to the last structure body 606 by sequentially selecting them, the test can be repeatedly carried out by returning to the initial structure body, or operation of the circuit may be stopped after the test is once carried out.

When the control circuit sequentially selects the structure bodies one by one as described above, the plurality of structure bodies in the test circuit can be tested.

Here, in FIG. 12A, the wireless communication circuit and the structure body are connected to the control circuit, and the wireless communication circuit and the structure body are not connected. This is because, as described above, a response signal from the structure body is transmitted to the wireless communication circuit through the control circuit. It is also possible to have a structure in which the wireless communication circuit and the structure body are connected, and a response signal from the structure body is directly outputted. In addition, it is possible that the test circuit has only one structure body and the control circuit inputs various signals to the structure body in accordance with a plurality of items to test one structure body on the plurality of items.

Further, a test circuit having another configuration will be described with reference to FIG. 12B. As shown in the drawing, a test circuit 607 includes a wireless communication circuit 608, a control circuit 609, and a structure body array 610 in which a plurality of structure bodies are arranged in a matrix. The wireless communication circuit includes an antenna or a power supply circuit as in the test circuit shown in Embodiment Mode 4 and FIG. 12A.

The control circuit 609 includes a driver 611 and a selector 612 which select one structure body from a plurality of structure bodies, and an IF 613 which transmits a signal of the structure body to the wireless communication circuit. A plurality of structure bodies which are arranged in an array-shape are sequentially selected one by one by the driver.

The driver of the control circuit can also include a decoder. In other words, the control circuit has a structure which selects one object from a plurality of objects (here, the structure body), similarly to, for example, a flat panel display or a memory. The test circuit having the above configuration selects one structure body by the control circuit and outputs a response signal thereof from the wireless communication circuit as in the test circuit shown in FIG. 12A.

By such a configuration of the test circuit, the plurality of structure bodies can be tested at one time. When the plurality of structure bodies in the test circuit are the same type structure bodies, the same test can be carried out to the plurality of structure bodies. In addition, when there is a different type structure body in the test circuit, a test on a different item can be carried out.

In such a manner, by forming a test circuit in which an antenna and a structure body are connected, a characteristic of a structure body during or after a manufacturing process can be tested without contact. In addition, time which is necessary to make a needle be in contact or to replace a needle is unnecessary; therefore, a test can be carried out speedily, and productivity can be improved. In addition, by a measurement using wireless communication, even when the number of structure bodies which are objects to be tested is high and there are a plurality of test items, a test can be carried out at one time; thus, time necessary for a test can be shortened.

In addition, since it is not necessary to carry out a test by needle contact using a prober, which is used in a general electric characteristic measurement, position precision in a test may not be strict, and a test can be easily carried out by a measurer. Further, differently from a general semiconductor element, the structure body has a three-dimensional spatial structure with a space; thus, a possibility of breaking the structure body by needle contact is extremely high. However, by a measurement without contact, the substrate is not concerned to be damaged by a needle, and thus, yield can be increased. Furthermore, the substrate can be returned to the process after the test. Therefore, the substrate is not required to be thrown away, and productivity can be improved.

It is to be noted that this embodiment mode can be implemented by being freely combined with the above embodiment modes.

Embodiment Mode 7

Figure 13:
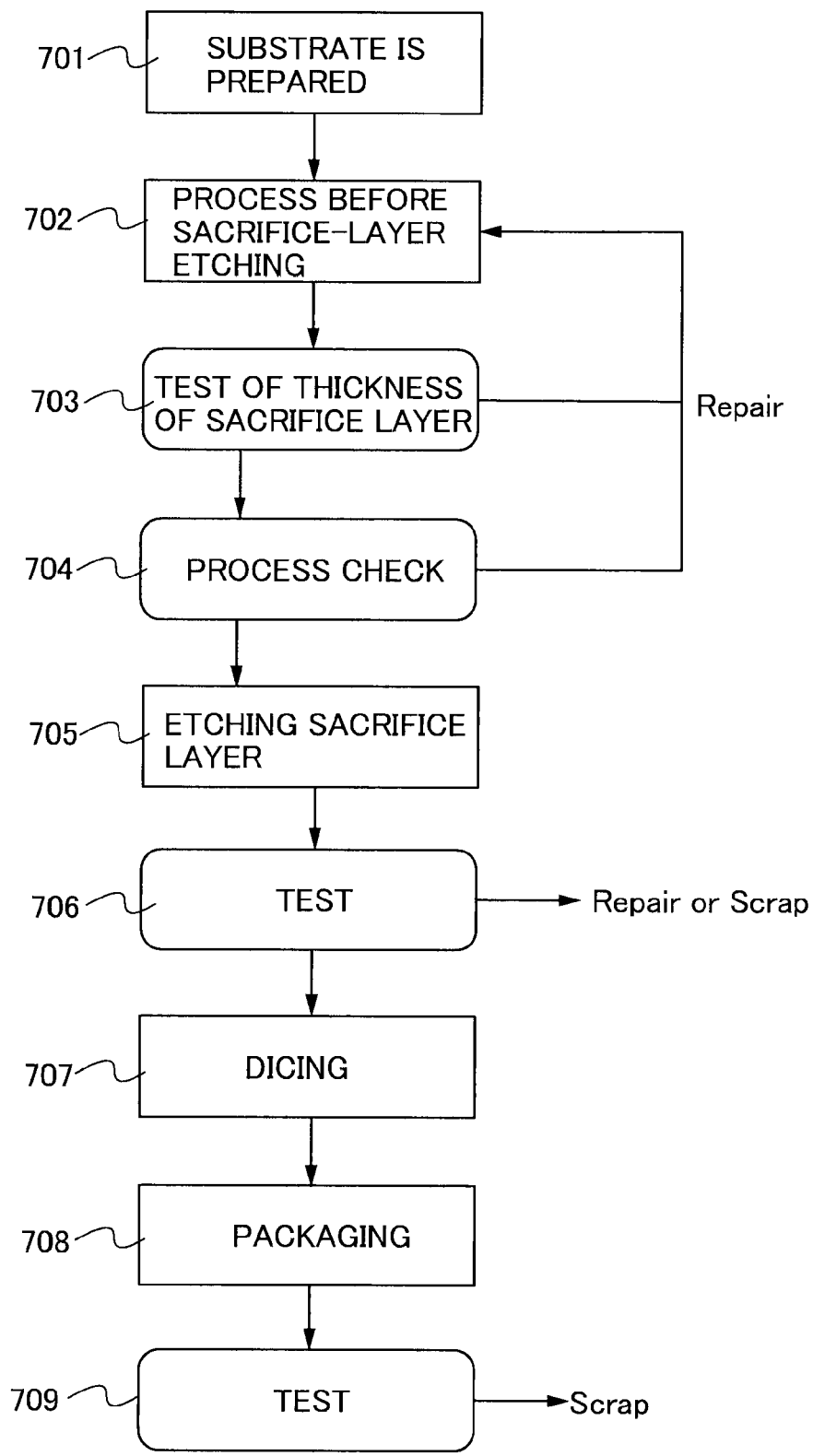
FIG. 13 is a view explaining a flow of manufacturing a micromachine according to the present invention.

This embodiment mode will describe a test method of a structure body by referring to a manufacturing flow of a structure body included a micromachine shown in FIG. 13.

When manufacturing a structure body, first, a substrate for manufacturing a structure body is prepared (step 701), and a manufacturing process proceeds before sacrifice layer-etching (step 702). In the process before sacrifice layer-etching, a fixed electrode, a sacrifice layer, and a structure layer are formed over a substrate as described in the above embodiment mode by employing a manufacturing method of a general semiconductor element.

Next, a test for confirming the process up to here, typically a test of a thickness of the sacrifice layer is carried out (step 703). In this test, the test circuit described in the above embodiment mode is manufactured, and the test can be carried out. When a defect is found, repairing such as re-deposition is possible.

When a structure layer is formed by stacking a plurality of layers as shown in FIG. 5B, the test of a thickness of the sacrifice layer may be carried out after all the structure layers are formed. Alternatively, only a conductive layer forming the structure layer (second conductive layer) may be formed as shown in FIG. 5A and tested, and then, an insulating layer may be formed to manufacture the structure layer. In such a manner, when the structure layer is partially formed and tested, repairing can be easily carried out in the case where a result of the test is nonconforming.

Subsequently, the sacrifice layer is removed by sacrifice layer-etching in the case of manufacturing the structure body. As described in Embodiment Mode 5, sacrifice layer-etching can be carried out only to the structure body for a test beforehand, and then, the structure body can be tested. Here, the process can be checked by removing part of the sacrifice layer over the substrate and measuring a characteristic of the structure body such as film stress of the structure layer, strain of the structure layer due to the film stress, or an operating voltage of the structure body (step 704).

When the tests in steps 703 and 704 are carried out before performing sacrifice layer-etching to the structure layer to be manufactured and a defect is found, a defective portion can be removed, and repairing such as re-deposition can be carried out.

When a measured value of the above test is in a range which can manufacture the structure body as expected at a time of designing, a space of the structure body is formed by removing the sacrifice layer by sacrifice layer-etching (step 705). Then, after sacrifice layer-etching, the test of a height of a space as described in Embodiment Mode 2, the test of an operating voltage as described in Embodiment Mode 4, and the like can be carried out (step 706). When it is confirmed by such a test that the structure body operates normally, the substrate is divided, and the structure body is made into a chip (step 707).

Thereafter, the chip is packaged to provide a final product (step 708), and a final test is carried out (step 709). In the packaging, only the structure body manufactured in the above process may be packaged, or an electric circuit manufactured in another process and the above structure body can be put in one package and electrically connected to each other by bonding so that a final product is provided.

In general, when a micromachine is manufactured, a test of confirming operation or the like of a structure body is not carried out over a manufacturing substrate. After a final product is manufactured by dividing the substrate and carrying out packaging, it is tested whether the structure body operates. This is because it is difficult to test all the structure bodies over the substrate, but the production efficiency is significantly reduced. However, as in a series of flows as described above to which the present invention is applied, when a test is carried out before sacrifice layer-etching, it becomes possible to repair a defect. In the case where all the tests as described above cannot be carried out, a test item may be appropriately determined depending on a structure body to be manufactured. However, when a defect is found before sacrifice layer-etching or before dividing the substrate as much as possible and is repaired, productivity can be improved.

It is to be noted that this embodiment mode can be implemented by being freely combined with the above embodiment modes.

Embodiment Mode 8

Figure 14A:
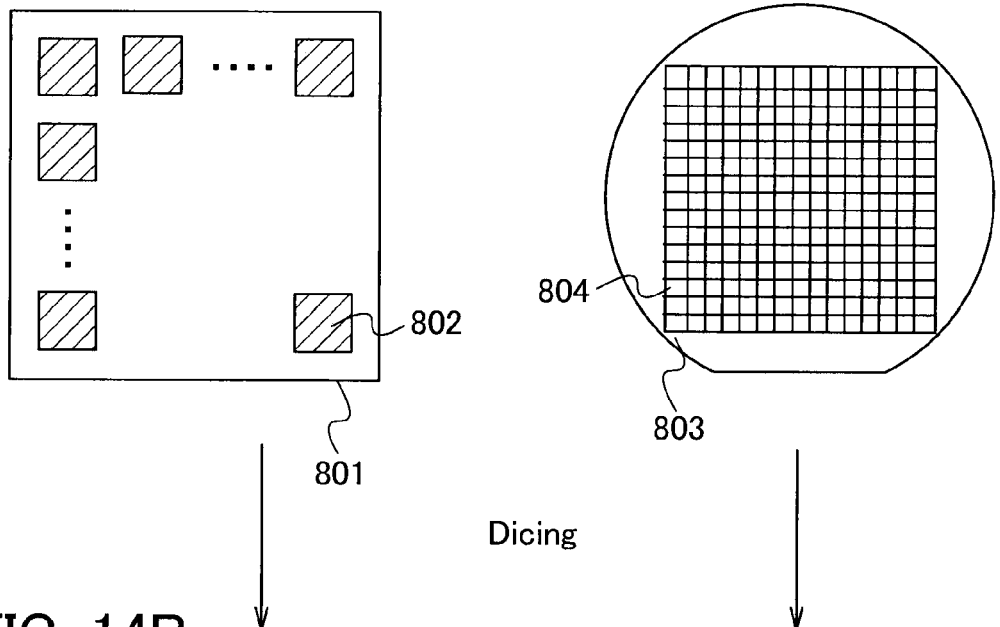
FIGS. 14A to 14C are views each explaining one example of a flow of manufacturing a micromachine according to the present invention.
Figure 14B:
Figure 14C:
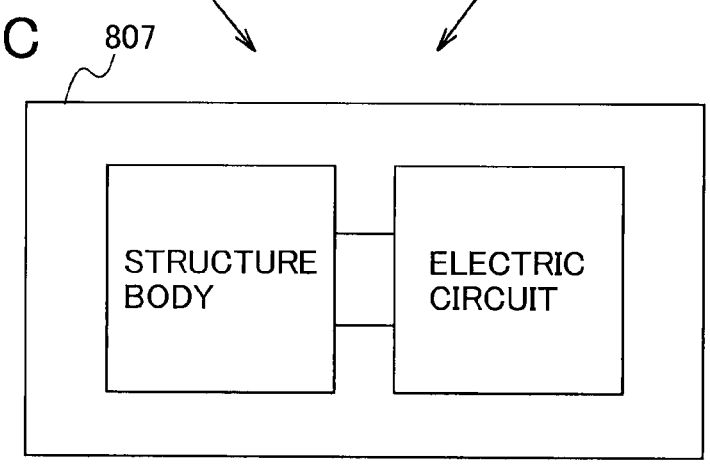

This embodiment mode will describe an example of applying the test method of a micromachine described in the above embodiment to a manufacturing method of a micromachine shown in FIGS. 14A to 14C. In order to manufacture a micromachine, as shown in FIG. 14A, a structure body 802 and an electric circuit 804 which controls the structure body are formed over different substrates 801 and 803, respectively. Then, as shown in FIG. 14B, a chip 805 having the structure body and a chip 806 having the electric circuit are formed by dividing the substrates, and as shown in FIG. 14C, the chips are put in the same package and electrically connected to each other by wire bonding so that a micromachine 807 that is a final product can be manufactured.

First, an example is shown, in which the test method shown in the step 706 of Embodiment Mode 7 is employed, and a conforming structure body is selected before the substrate is divided. For example, as shown in FIGS. 15A to 15D, a structure body 816 for forming a micromachine and a TEG (Test Element Group) 817 for evaluating a characteristic of the structure body are manufactured over the same substrate 815.

After a process of manufacturing the structure body, a TEG provided over each substrate is tested. When the TEG is to be a test circuit described in the above embodiment mode, a test can be carried out without contact. For example, in this test, some TEGs are tested by a contact test method, and a test circuit which is confirmed to operate normally is tested without contact. This test result is to be a reference result, and TEG evaluation can be carried out by comparing a test result of another TEG by a non-contact test method with the reference result. Here, a diagram like an allowable-characteristic diagram in the non-contact measurement may be formed from the measurement result by the contact test method to be a comparison reference.

Figure 15A:
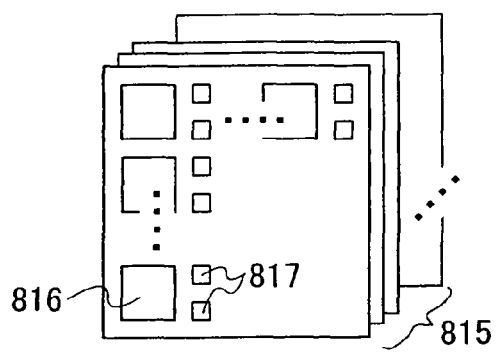
FIGS. 15A to 15D are views each explaining one example of a flow of manufacturing a micromachine according to the present invention.
Figure 15B:
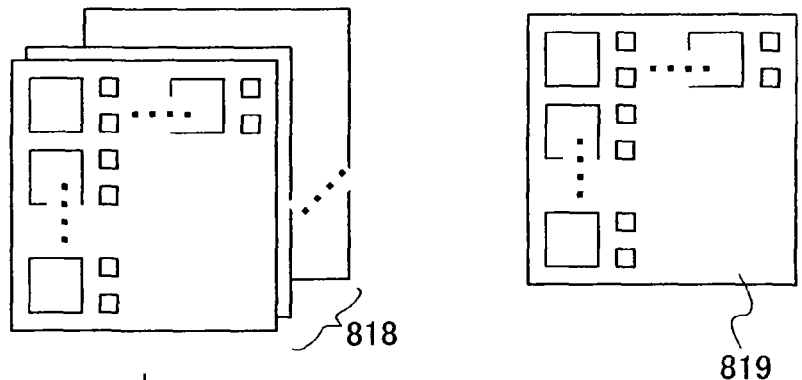
Figure 15C:
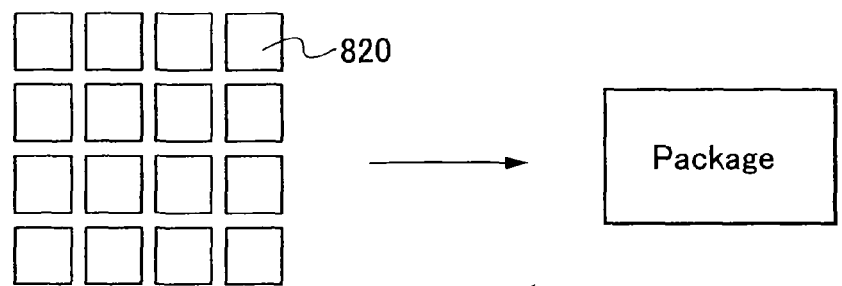

Then, as shown in FIG. 15B, by the above evaluation, the substrates are separated into a substrate 818 in which a TEG characteristic is in a normal range and a substrate 819 in which a TEG characteristic is not in a normal range. The substrate 818, which is determined that a TEG characteristic is in a normal range, is divided as shown in FIG. 15C into a chip 820 having the structure body. As for the substrate 819 in which the TEG is not in a normal range, since a characteristic of the manufactured structure body is possibly bad, a detailed test is carried out again to evaluate whether the structure body is defective or not defective, and moreover, it is desirable to give feed back on process control.

Figure 15D:
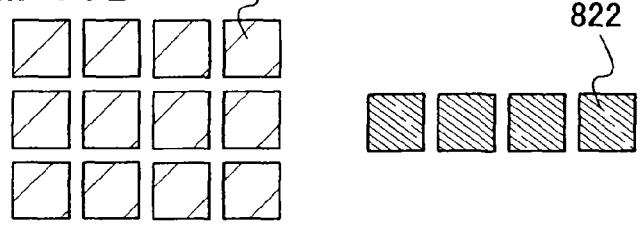

The chip 820 having the structure body may be directly packaged, but each of the chips 820 may also be tested. When the chip is provided with an antenna as in the test circuit described in the above embodiment mode, each chip can be tested by a non-contact method, and when the chip is not provided with an antenna, each chip can be tested by a contact method. Then, as shown in FIG. 15D, it is also possible that the chips are separated into a chip 821 which is confirmed to operate normally and a chip 822 which is not confirmed to operate, and only the chip which operates normally is packaged to manufacture a micromachine.

In such a manner, it becomes possible to cut a structure body into a chip after it is determined whether the structure body is manufactured normally based on a substrate unit. When a test is carried out before packaging and the chip having the conforming structure body is selected, productivity of a micromachine which is finally manufactured can be improved.

Figure 16A:
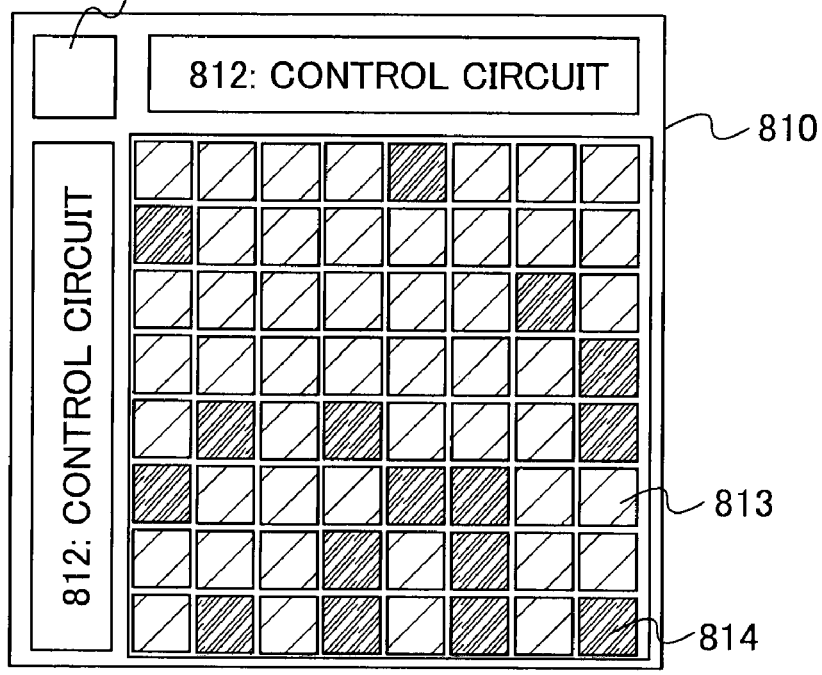
FIGS. 16A and 16B are views each explaining one example of a flow of manufacturing a micromachine according to the present invention.
Figure 16B:
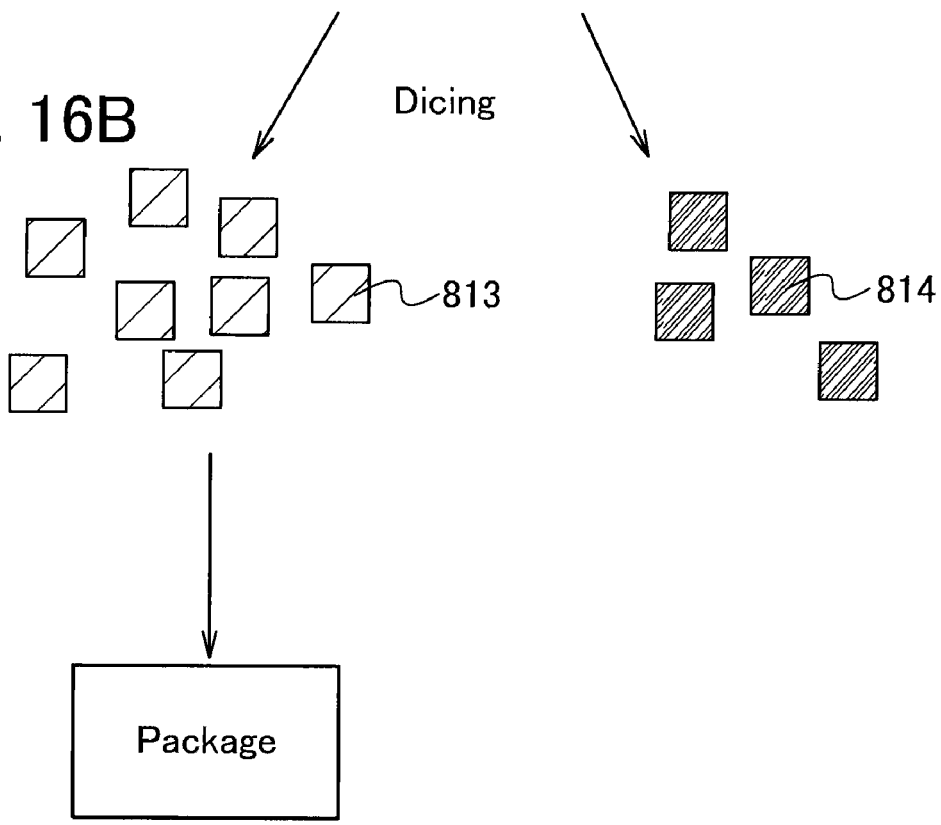

In addition, it is also possible to employ a test method of a plurality of structure bodies without contact at one time by using the test circuit described in Embodiment Mode 5. As shown in FIG. 16A, over a substrate 810, a test circuit including a wireless communication circuit 811, a control circuit 812, and a plurality of structure bodies is formed, and characteristics of all the structure bodies that are manufactured are tested. By the test, the structure bodies over the substrate are evaluated into a structure body 813 which operates normally and a structure body 814 which does not operate normally. Then, as shown in FIG. 16B, it is possible that the substrate is divided into chips, and chips each having the structure body which operates normally are packaged.

When dividing the substrate, the circuit necessary for a test is cut away, and only a portion (structure body) which is necessary for the product is taken out. For example, the test circuit in FIG. 16A includes the wireless communication circuit 811, the control circuit 812, and the plurality of structure bodies, and the structure bodies are cut away from the substrate in dicing to form the chips. In such a manner, when the plurality of structure bodies are connected to form one circuit, it is necessary to take out individual chips by dividing the substrate. Therefore, a layout design is necessary so as to take out only the structure body by dividing the substrate.

The electric circuit 804 of the micromachine is manufactured by using an LSI manufacturing technique and tested, and a chip which operates normally is selected and packaged. However, the structure body 802 is not tested over the substrate 801, and the micromachine 807 is tested after being packaged; therefore, production efficiency is significantly reduced. However, by employing the measuring method according to the present invention as described above, all the structure bodies before manufacturing the micromachine can be tested. In addition, it becomes possible to determine whether the structure body is manufactured normally based on a substrate unit and to divide the structure bodies into chips. Consequently, production efficiency is improved, and a test of a defect in the micromachine can be rapidly carried out.

It is to be noted that this embodiment mode can be implemented by being freely combined with the above embodiment modes.

Embodiment Mode 9

This embodiment mode will describe one example of a manufacturing method of the test circuit described in the above embodiment modes. For example, a manufacturing method of a test circuit including an antenna and a structure body as described in Embodiment Mode 1 will be described with reference to FIGS. 17A to 17C, 18A and 18B, and 19A and 19B. The drawings are cross-sectional views shown in the order of steps, and an antenna is shown on the left side and a structure body is shown on the right side.

Figure 17A:
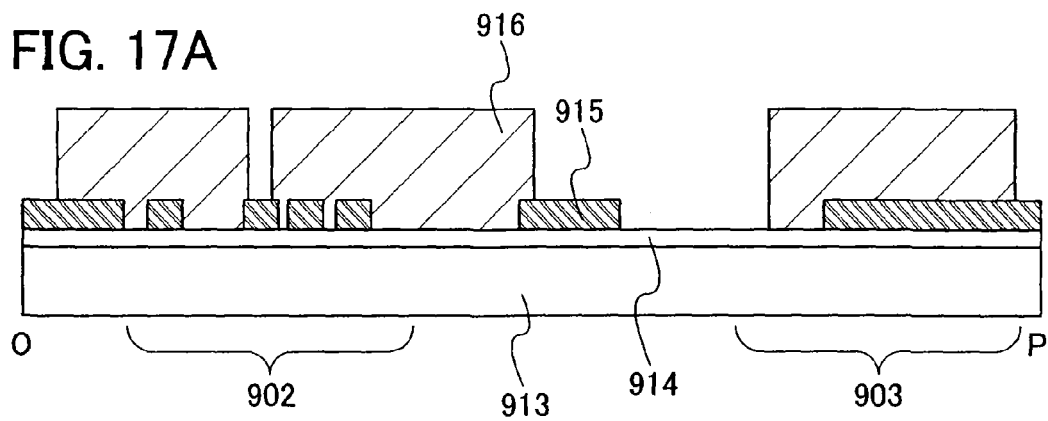
FIGS. 17A to 17C are views each explaining a manufacturing method of a structure body according to the present invention.

First, as shown in FIG. 17A, a conductive material (such as metal, metal oxide, and a conductive organic material) is formed over a substrate 913 and processed; thus, a first conductive layer 915 is formed. The first conductive layer 915 becomes an antenna 902 and a fixed electrode (a first conductive layer) of a structure body 903. In addition, the antenna 902 and the fixed electrode of the structure body 903 are connected by the first conductive layer 915 (not illustrated). Here, the substrate 913 may be used directly; however, the first conductive layer can also be formed after a protective layer 914 is formed, and the drawing shows an example in which the protective layer 914 is formed over the substrate, and the first conductive layer is formed thereover.

Subsequently, an insulating material (such as silicon oxide, silicon nitride, or an insulating organic material) is formed over the first conductive layer 915 and processed; thus, a first insulating layer 916 is formed. The first insulating layer 916 becomes a sacrifice layer in a portion of the structure body 903 and becomes an interlayer film for insulating a wiring which is extracted from the center of the antenna in a portion of the antenna 902.

Figure 17B:
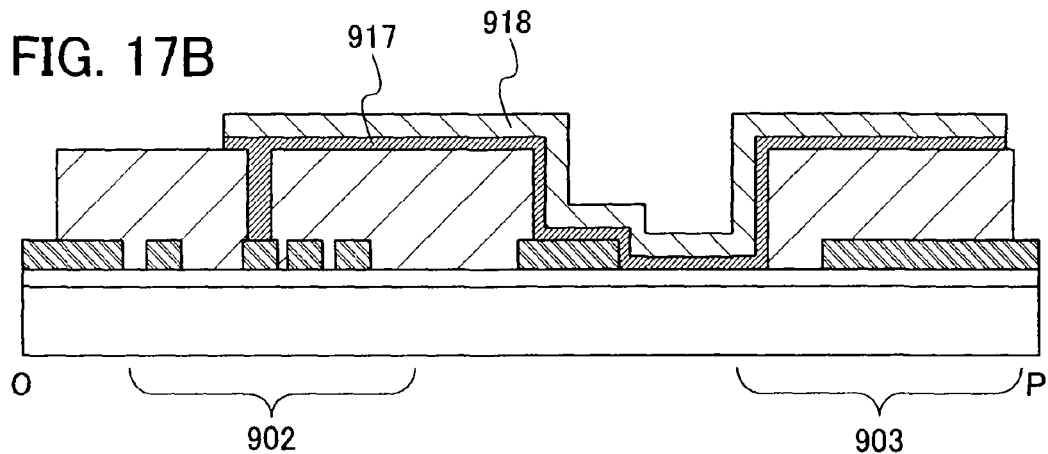

Then, as shown in FIG. 17B, over the first insulating layer 916, a second conductive layer 917 and a second insulating layer 918 are formed and processed; thus, a structure layer of the structure body is formed. This structure layer may have a single layer structure having only a conductive layer, but a structure layer stacking a conductive layer and an insulating layer is shown here. In addition, the conductive layer and the insulating layer can be formed and processed separately, but an example in which two layers are sequentially formed and then processed in a self-alignment manner at one time is shown here. This is because, by processing in a self-alignment manner, a photolithography step and a photomask used in the step can be reduced. The second conductive layer 917 serves as a movable electrode of the structure body 903 and a wiring for connecting the movable electrode of the structure body by extracting a wiring from the antenna 902.

When components are formed up to here, by using this test circuit, the test described in the above embodiment mode, such as a test of a thickness of the sacrifice layer can be carried out. In addition, a test can also be carried out at a time when only the second conductive layer 917 is formed before forming the second insulating layer 918.

Figure 17C:
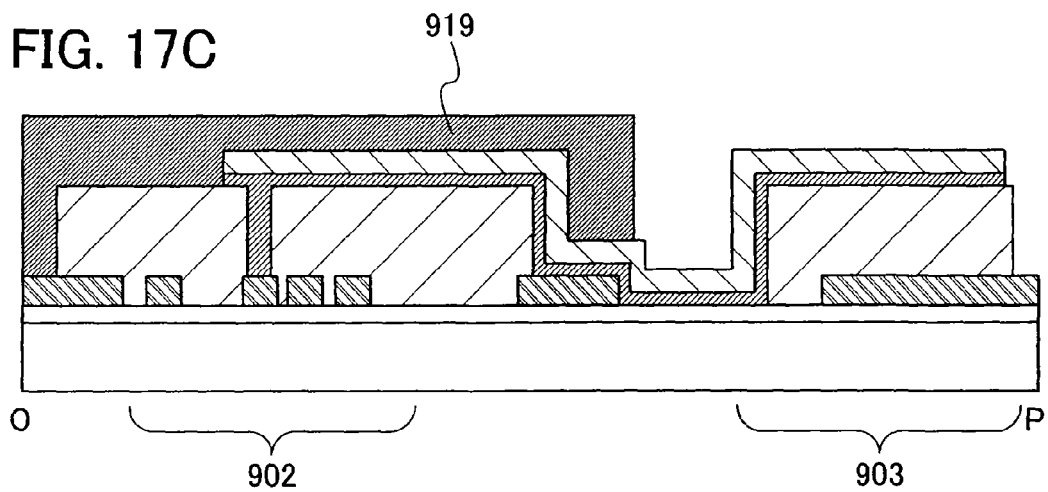

Next, as shown in FIG. 17C, over the second conductive layer forming the antenna and the second insulating layer, a material which has a selective ratio to the first insulating layer is formed and processed; thus, a protective layer 919 is formed. This protective layer 919 is a protective layer to prevent the first insulating layer in the antenna portion from being etched when carrying out sacrifice layer-etching to manufacture the structure body 903.

Subsequently, the sacrifice layer is removed by carrying out sacrifice layer-etching, and the structure body 903 having a space and the antenna 902 can be formed. By using the test circuit manufactured as described above, it is possible to carry out the test described in the above embodiment mode, such as a test of a height of the space, a test whether the sacrifice layer is removed, or a test of an operating voltage.

The test circuit having the antenna and the structure body can be manufactured by employing a manufacturing method of a general semiconductor element. For example, deposition can be carried out by a CVD method, a sputtering method, an evaporation method, or the like, and each film or layer can be processed by carrying out a photolithography method and etching. Then, by combining the conductive layer and the insulating layer as described above, the test circuit having the antenna and the structure body can be formed.

In the above description, the antenna is formed by using the first conductive layer, but the antenna can also be formed by using the second conductive layer. An example thereof will be described with reference to FIGS. 18A and 18B.

As shown in FIG. 18A, a protective layer 921 is formed over a substrate 920, and a first conductive layer 922 is formed thereover. The first conductive layer 922 forms a fixed electrode of a structure body 903 and also serves as a wiring to connect an antenna 902 and the fixed electrode. Then, a first insulating layer 923 is formed over the first conductive layer 922. The first insulating layer 923 serves as a sacrifice layer of the structure body 903 and also serves as an interlayer film in a portion of the antenna 902 so as to insulate a wiring extracted from the center of the antenna. Then, a second conductive layer 924 and a second insulating layer 925 are formed over the first insulating layer 923 and processed; thus, a structure layer of the structure body and the antenna are formed. Here, the second conductive layer serves as a movable electrode of the structure body 903, and the antenna and the movable electrode of the structure body are connected by the second conductive layer (not illustrated).

Over the second conductive layer which forms the antenna 902 and the second insulating layer, a material which has a selective ratio to the first insulating layer is formed and processed; thus, a protective layer is formed. Then, the sacrifice layer is removed by carrying out sacrifice layer-etching, and thus, the structure body having a space and the antenna can be formed.

However, as shown in FIG. 18B, by carrying out sacrifice layer-etching without forming the protective layer as described above, an antenna 902 which is apart from a substrate 920 through a space 926 can be formed in addition to a structure body having the space 926. Such an antenna is not easily damaged by a noise from the substrate or a conductive layer around the substrate. By manufacturing the antenna and the structure body as described above, a high-sensitive antenna can be formed, and a highly precise test can be carried out. It is to be noted that the formation example here is one example, and the test circuit can be manufactured by various methods.

In addition, when the test circuit has a power supply circuit or a control circuit, it is necessary to form a capacitor or a semiconductor element over the same substrate. Although there are various methods for manufacturing a semiconductor element and a structure body over the same substrate, an example of forming a thin film transistor and a structure body over the same substrate will be shown here with reference to FIGS. 19A and 19B.

Figure 19A:
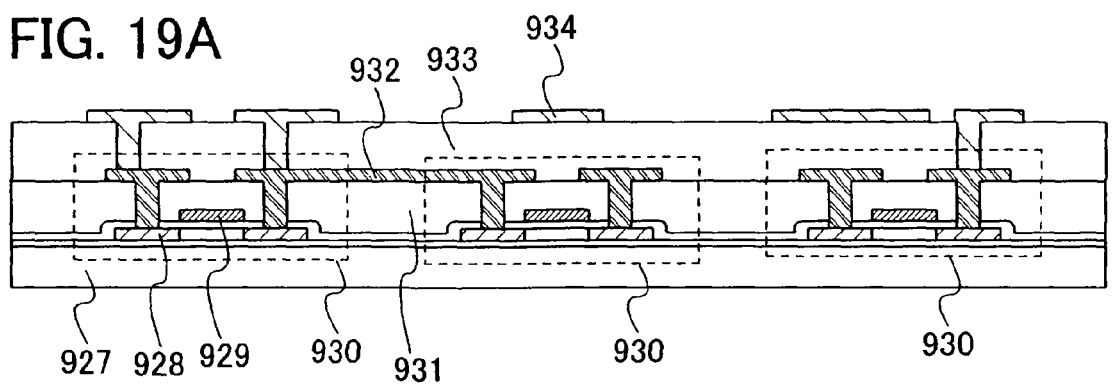
FIGS. 19A and 19B are views each explaining a manufacturing method of a micromachine according to the present invention.

First, as shown in FIG. 19A, a method for forming a semiconductor element will be described. An insulating layer is formed over a substrate 927. The insulating layer is formed by using silicon oxide, silicon nitride, or the like. Then, a semiconductor layer 928 is formed over the insulating layer. The semiconductor layer is crystallized by laser crystallization, thermal crystallization using a metal catalyst, or the like, and is processed into a desired shape (patterning). Next, a gate insulating layer is formed to cover the semiconductor layer. The gate insulating layer is formed by using silicon oxide, silicon nitride, or the like.

Next, a gate electrode layer 929 is formed. The gate electrode layer 929 is formed by forming a conductive layer using a conductive element or compound and patterning the conductive layer into a desired shape. In the case of patterning by a photolithography method, a resist mask may be etched by plasma or the like, thereby narrowing the width of the gate electrode and enhancing the performance of a transistor. Next, an n-type impurity region and a p-type impurity region are formed by adding an impurity element to the semiconductor layer. The impurity region is formed by forming a resist mask by a photolithography method and adding an impurity element such as phosphorus, arsenic, or boron. Subsequently, an insulating layer is formed using a nitrogen compound or the like, and anisotropic etching in a perpendicular direction is carried out to the insulating layer, thereby forming an insulating layer (sidewall) in contact with a side surface of the gate electrode. Next, an impurity is added to the semiconductor layer including the n-type impurity region, and thus, a first n-type impurity region right below the sidewall and a second n-type impurity region having a higher impurity concentration than that of the first n-type impurity region are formed. By the aforementioned steps, n-type and p-type semiconductor elements 930 are formed.

The semiconductor layer included in the semiconductor element, which is formed by the aforementioned process, may use any of an amorphous semiconductor, a microcrystal semiconductor, a nanocrystal semiconductor, a polycrystal semiconductor, an organic semiconductor, and the like. In order to obtain a semiconductor element with a favorable characteristic, a crystalline semiconductor layer (a low temperature polysilicon layer) crystallized at temperatures of 200 to 600° C. (preferably 350 to 500° C.) or a crystalline semiconductor layer (a high temperature polysilicon layer) crystallized at temperatures of higher than or equal to 600° C. can be used. In order to obtain a semiconductor element with a further-favorable characteristic, a semiconductor layer crystallized using a metal element as a catalyst or a semiconductor layer crystallized by a laser irradiation method may be used. Moreover, a semiconductor layer formed by a plasma CVD method using a gas containing $SiH_4$ and $F_2$, a gas containing $SiH_4$ and $H_2$, or the like, or this semiconductor layer irradiated with laser may be used. The semiconductor layer of the semiconductor element in the circuit may be formed to have a crystal boundary which extends in parallel to a direction of a carrier flow (a channel length direction). Such an active layer can be formed by using a continuous wave oscillation laser (can be abbreviated as CWLC) or a pulsed laser which operates at 10 MHz or higher, preferably 60 to 100 MHz. Moreover, a thickness of the semiconductor layer is 20 to 200 nm, preferably 50 to 150 nm. By adding a hydrogen or halogen element to the semiconductor layer (in particular, a channel forming region) at a concentration of $1\times10^{19}$ to $1\times10^{11}$ atoms/$cm^3$, preferably at a concentration of $1\times10^{19}$ to $5\times10^{20}$ atoms/$cm^3$, an active layer which has few defects and hardly cracks can be obtained.

The semiconductor element formed as described above has an S value (sub-threshold value) of lower than or equal to 0.35 V/dec, preferably 0.09 to 0.25 V/dec. The mobility is preferably higher than or equal to 10 $cm^2$/Vs. Further, the semiconductor element preferably has a characteristic of higher than or equal to 1 MHz, preferably higher than or equal to 10 MHz, by a ring oscillator which operates with a power supply voltage of 3 to 5 V. In addition, the semiconductor element described in this embodiment mode has a structure in which a semiconductor layer, a gate insulating layer, and a gate electrode layer are sequentially stacked over a substrate; however, the present invention is not limited to this example. For example, a structure in which a gate electrode layer, an insulating film, and a semiconductor layer are sequentially stacked may be employed as well. Further, in this embodiment mode, an n-type semiconductor element has a first n-type impurity region and a second n-type impurity region; however, the present invention is not limited thereto, and the impurity regions may have the same impurity concentrations.

In addition, the semiconductor element may be provided in a plurality of layers. In the case of manufacturing with a multilayer structure, a low dielectric constant material may be used as a material for an interlayer insulating film in order to reduce parasitic capacitance between layers. For example, a resin material such as an epoxy resin or an acrylic resin, a compound material formed by polymerization of a siloxane based polymer or the like, and the like can be used. When parasitic capacitance is reduced in a multilayer structure, a small area, high speed operation, and low power consumption can be achieved. In addition, by providing a protective layer to prevent contamination due to alkali metal, reliability can be improved. The protective layer may be formed by using an inorganic material such as aluminum nitride or a silicon nitride film so as to wrap the semiconductor element in the circuit or to wrap the entire circuit.

Then, an insulating layer 931 is formed so as to cover the semiconductor element 930. The insulating layer is formed by using an insulating inorganic compound, organic compound, or the like. Next, contact holes are formed so as to expose the second n-type impurity region and the p-type impurity region, a conductive layer is formed so as to fill the openings, and the conductive layer is patterned into a desired shape. The conductive layer is formed using a conductive metal element, compound, or the like.

Subsequently, an insulating layer 933 is formed so as to cover the conductive layer. The insulating layer 933 is formed by using an insulating inorganic compound, organic compound, or the like. Next, a contact hole is formed so as to expose the conductive layer, a conductive layer is formed so as to fill the opening, and the conductive layer is patterned into a desired shape; therefore, a fixed electrode of a structure layer (a first conductive layer 934) is formed. It is to be noted that the fixed electrode may serve as a wiring to connect the antenna and the fixed electrode.

Figure 19B:
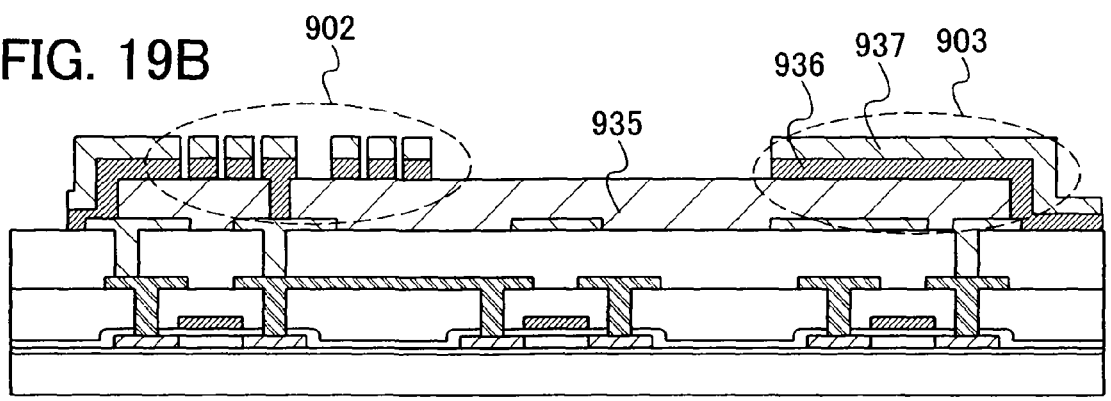

Then, as shown in FIG. 19B, a first insulating layer 935 is formed over the first conductive layer 934. The first insulating layer serves as a sacrifice layer of the structure body as well as an interlayer film in the antenna portion so as to insulate a wiring extracted from the center of the antenna. Then, a second conductive layer 936 and a second insulating layer 937 are formed over the first insulating layer and processed; thus, a structure layer of the structure body and an antenna are formed. Here, the second conductive layer serves as a movable electrode of the structure body, and the antenna and the movable electrode of the structure body are connected by the second conductive layer (not illustrated). Over the second conductive layer forming the antenna and the second insulating layer, a material which has a selective ratio to the first insulating layer is formed and processed; thus, a protective layer is formed. Then, the sacrifice layer is removed by carrying out sacrifice layer-etching, and thus, the structure body 903 having a space and the antenna 902 can be formed.

Each of the insulating layer, the conductive layer, the semiconductor element, and the structure body can be formed with a single layer structure using a single material or a stacked layer structure using a plurality of materials.

As described above, by forming a test circuit which has a semiconductor element, an antenna, and a structure body and by employing the test method according to the present invention, a structure body during or after a manufacturing process can be tested.

As for the structure body which is manufactured as described above and evaluated to be conforming by a test, the substrate is divided, and a generated chip can be used to assemble the micromachine. Therefore, when dividing the substrate, the circuit which is necessary only for a test is cut away, and only a portion necessary for the product can be taken out.

Figure 20A:
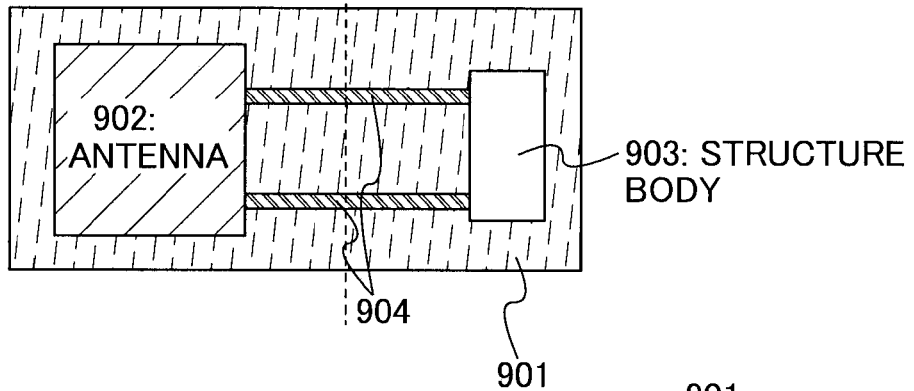
FIGS. 20A to 20C are views each explaining a manufacturing method of a micromachine according to the present invention.

For example, the case where a structure body is taken out from a test circuit to be a chip will be described with reference to FIGS. 20A to 20C. As shown in FIG. 20A, when a test circuit 901 includes an antenna 902 and a structure body 903, a wiring 904 which connects the antenna 902 and the structure body 903 is cut in a portion shown by a dotted line so that the antenna 902 and the structure body 903 are separated. Thus, the structure body 903 can be taken out as a chip for manufacturing a micromachine.

Figure 20B:
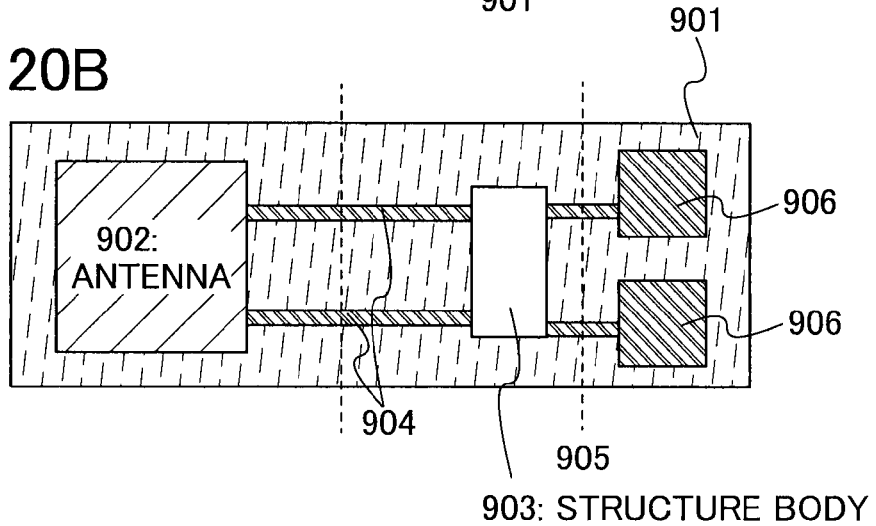

In addition, as shown in FIG. 20B, when a structure body 903 and a pad 906 are connected in a test circuit 901, wirings 904 and 905 which connect the structure body 903, an antenna 902, and the pad 906 are cut in a portion shown by a dotted line so that the antenna 902 and the pad 906 are separated from the structure body 903. Thus, the structure body 903 can be taken out as a chip. In this case, the disconnected wiring 904 is connected to the structure body 903. It is also possible to cut only the wiring 904 which connects the structure body 903 and the antenna 902 and use the pad 906 as a bonding pad to connect an electric circuit.

Figure 12B:
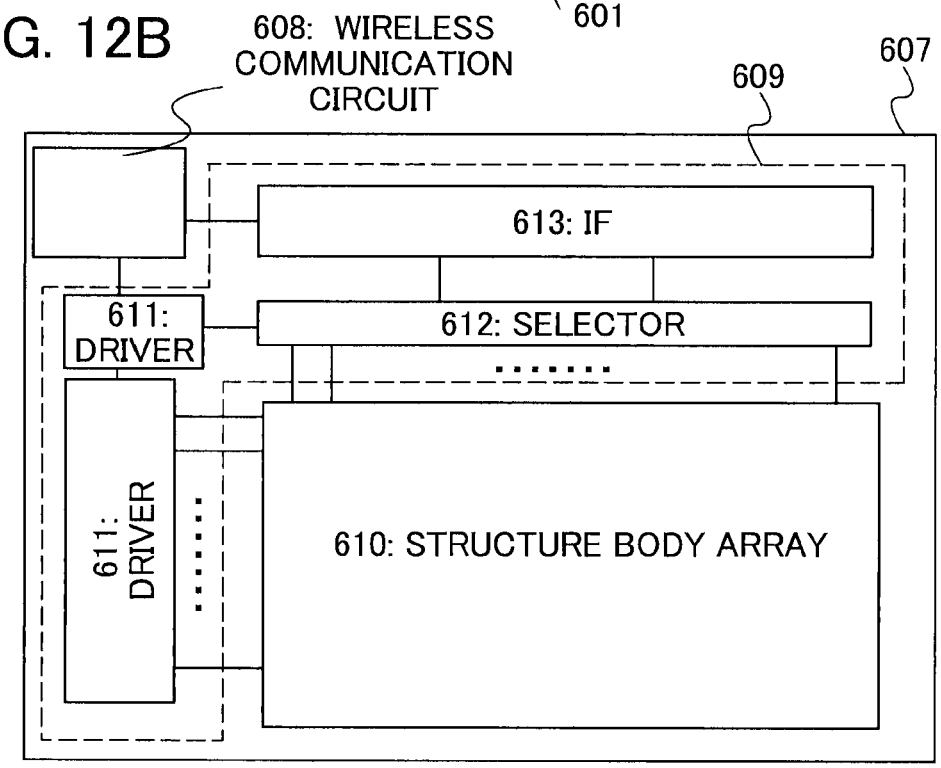

In addition, as shown in FIGS. 12A, 12B, and 16A, even when the test circuit includes a peripheral circuit such as a capacitor, a power supply circuit, or a control circuit, the substrate can be divided in a wiring portion which connects the structure body and the circuit, and only the structure body can be taken out as a chip. Similarly, it is also possible to design a peripheral circuit such as a power supply circuit or a control circuit included in a test circuit so as to be incorporated into a micromachine, cut the antenna which is connected to the structure body and the peripheral circuit through the wiring in the wiring portion, form the structure body and the peripheral circuit into a chip, and package them as a micromachine. It is to be noted that the wiring which connects the structure body and the peripheral circuit to the antenna is not always necessary. For example, the structure body, the peripheral circuit, and the antenna can also be connected directly not through the wiring. In this case, the antenna is cut.

Figure 20C:
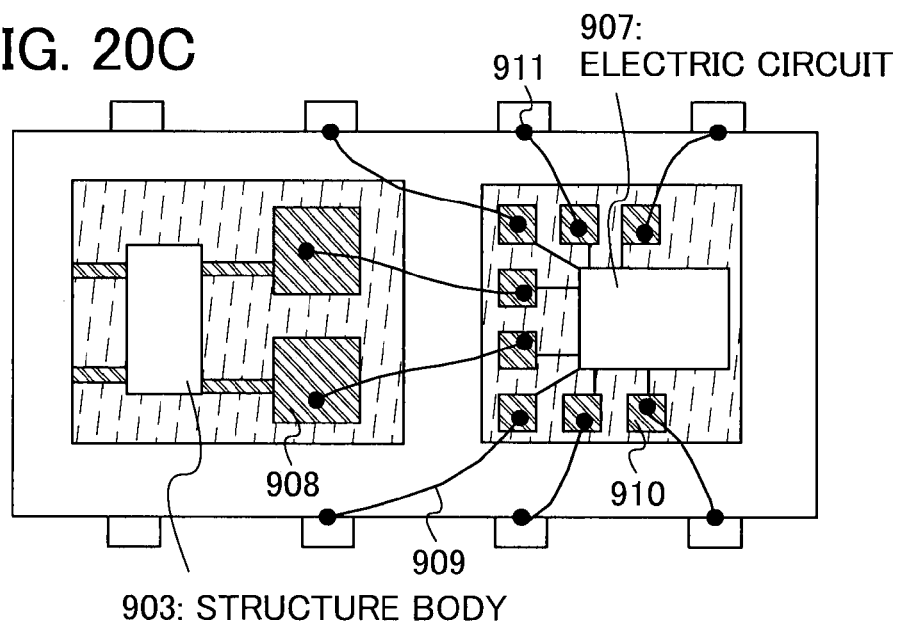

Then, the structure body 903 that is divided and cut from the peripheral circuit in the wiring is packaged with an electric circuit 907 manufactured over another substrate as shown in FIG. 20C. For example, as shown in the drawing, the structure body 903 and the electric circuit 907 can be connected to each other by a wire bonding 909 using pads 908 and 910. In addition, an example in which the pad 910 provided over a chip having the electric circuit 907 is connected to a terminal 911 of the package by the wire bonding 909 is shown.

Here, an example in which a structure body and an electric circuit are manufactured over different substrates to form a chip and the chip is packaged is shown. However, by employing a manufacturing process of a semiconductor element shown in this embodiment mode, it is also possible to manufacture a structure body and an electric circuit over the same substrate and package them. Also at this time, when a plurality of circuits and structure bodies are connected to each other by a wiring, the substrate can be divided in the wiring portion as in the above case, and each chip can be packaged. Further, this wiring to be cut may be a wiring which connects the structure body and a portion that is not a peripheral circuit, such as a power supply to apply a common potential in a test. In such a manner, by laying out the structure body so as to be cut in the wiring portion and manufacturing the structure body over the substrate, a plurality of structure bodies can be manufactured over the same substrate, and further, the structure bodies over the substrate can be tested.

As described above, when the structure body included in the test circuit described in the above embodiment mode is cut in the wiring portion, a micromachine can be manufactured by using the structure body which is tested. By manufacturing the micromachine as described above, the structure body which is confirmed to operate can be packaged, and an electric circuit which is packaged together, a package material, and the like are not wasted.

It is to be noted that this embodiment mode can be implemented by being freely combined with the above embodiment modes.

This application is based on Japanese Patent Application serial no. 2005-350035 filed in Japan Patent Office on Dec. 2, 2005, the entire contents of which are hereby incorporated by reference.

What is claimed is:

1. A method for testing a microstructure body including a first conductive layer, a second conductive layer, and a sacrifice layer provided between the first conductive layer and the second conductive layer, comprising the steps of:
   supplying electric power to the microstructure body wirelessly through an antenna connected to the microstructure body;
   detecting an electromagnetic wave generated from the antenna as a characteristic of the microstructure body; and
   etching the sacrifice layer to form a space between the first conductive layer and the second conductive layer after the detecting step.

2. A method for testing a microstructure body including a first conductive layer, a second conductive layer, and a sacrifice layer provided between the first conductive layer and the second conductive layer, comprising the steps of:
   connecting the microstructure body to a power supply circuit;
   supplying electric power to the microstructure body and the power supply circuit wirelessly through an antenna connected to the microstructure body and the power supply circuit;
   detecting an electromagnetic wave generated from the antenna as a characteristic of the microstructure body; and
   etching the sacrifice layer to form a space between the first conductive layer and the second conductive layer after the detecting step.

3. A method for testing a microstructure body including a first conductive layer, a second conductive layer, and a sacrifice layer provided between the first conductive layer and the second conductive layer, comprising the steps of:
   connecting the microstructure body to a power supply circuit;
   supplying electric power to the microstructure body and the power supply circuit wirelessly through an antenna connected to the microstructure body and the power supply circuit;
   detecting an electromagnetic wave generated from the antenna as a characteristic of the microstructure body and the power supply circuit; and
   etching the sacrifice layer to form a space between the first conductive layer and the second conductive layer after the detecting step.

4. A method for testing a microstructure body including a first conductive layer, a second conductive layer, and a sacrifice layer provided between the first conductive layer and the second conductive layer, comprising the steps of:
   connecting the microstructure body to a control circuit;
   connecting the control circuit to a power supply circuit;
   supplying electric power to the microstructure body, the control circuit, and the power supply circuit wirelessly through an antenna connected to at least one of the microstructure body, the control circuit, and the power supply circuit;
   detecting an electromagnetic wave generated from the antenna as a characteristic of the microstructure body; and
   etching the sacrifice layer to form a space between the first conductive layer and the second conductive layer after the detecting step.

5. The method for testing a microstructure body according to any one of claims 1 to 4, wherein a frequency or intensity of the electric power is changed, and a current flowing in the microstructure body is detected as the characteristic in relation to a change in frequency or intensity of the electric power.

6. The method for testing a microstructure body according to any one of claims 1 to 4, wherein the first conductive layer and the second conductive layer are provided in parallel.

7. The method for testing a microstructure body according to any one of claims 1 to 4, wherein the microstructure body forms a micromachine.

* * * * *